United States Patent
Iwakuma et al.

(10) Patent No.: US 8,039,121 B2
(45) Date of Patent: Oct. 18, 2011

(54) ORGANIC ELECTROLUMINESCENCE DEVICE

(75) Inventors: Toshihiro Iwakuma, Sodegaura (JP);
Masahide Matsuura, Sodegaura (JP);
Hideaki Nagashima, Sodegaura (JP);
Hidetsugu Ikeda, Sodegaura (JP);
Hiroaki Nakamura, Sodegaura (JP);
Tadashi Kusumoto, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 908 days.

(21) Appl. No.: 11/480,463

(22) Filed: Jul. 5, 2006

(65) Prior Publication Data
US 2007/0054151 A1     Mar. 8, 2007

(30) Foreign Application Priority Data
Sep. 8, 2005 (JP) .................. 2005-261002

(51) Int. Cl.
*H01L 51/54* (2006.01)

(52) U.S. Cl. ........ 428/690; 428/917; 313/504; 313/506; 257/40; 257/102; 257/103

(58) Field of Classification Search .................. 428/690, 428/917; 313/504, 506; 257/40, 102, 103
See application file for complete search history.

(56) References Cited

U.S. PATENT DOCUMENTS

| | | | |
|---|---|---|---|
| 6,863,997 B2 | 3/2005 | Thompson et al. | |
| 2004/0004433 A1 | 1/2004 | Lamansky et al. | |
| 2005/0084711 A1* | 4/2005 | Sasaki et al. ................. | 428/690 |
| 2006/0035109 A1 | 2/2006 | Arakane et al. | |

FOREIGN PATENT DOCUMENTS

EP    1202608 A2 *   5/2002
JP    2002-203683    7/2002
(Continued)

OTHER PUBLICATIONS

U.S. Appl. No. 10/588,773, filed Aug. 8, 2006, Iwakuma, et al.
(Continued)

*Primary Examiner* — David W Wu
*Assistant Examiner* — Vu A Nguyen
(74) *Attorney, Agent, or Firm* — Oblon, Spivak, McClelland, Maier & Neustadt, L.L.P.

(57) ABSTRACT

An organic electroluminescent device (1) including an anode (2), a cathode (6), and at least a first layer (3), a second layer (4), and a third layer (5) provided between the anode (2) and the cathode (6) in that order from the anode side. At least one of the first to third layers (3), (4), and (5) includes a phosphorescent compound. At least one of the first to third layers (3), (4), and (5) is an emitting layer. At least three compounds respectively forming the first layer (3), the second layer (4), and the third layer (5) other than the phosphorescent compound are compounds of the following formula (1).

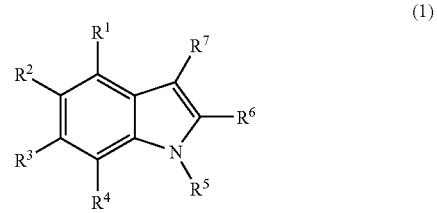

(1)

wherein $R^1$ to $R^7$ each represent a hydrogen atom or a substituent, provided that adjacent substituents may form a ring.

29 Claims, 1 Drawing Sheet

FOREIGN PATENT DOCUMENTS

| | | |
|---|---|---|
| JP | 2004-220931 | 8/2004 |
| WO | WO 02/01653 | 1/2002 |
| WO | WO 2004/074399 A1 | 9/2004 |
| WO | WO 2005/076669 A1 | 8/2005 |

OTHER PUBLICATIONS

U.S. Appl. No. 11/480,465, filed Jul. 5, 2006, Iwakuma, et al.
U.S. Appl. No. 10/567,903, filed Feb. 10, 2006, Iwakuma, et al.
U.S. Appl. No. 10/574,179, filed Mar. 30, 2006, Iwakuma, et al.
U.S. Appl. No. 10/575,092, filed Apr. 7, 2006, Arakane, et al.
U.S. Appl. No. 10/588,233, filed Aug. 3, 2006, Matsuura, et al.
U.S. Appl. No. 10/588,786, filed Aug. 9, 2006, Matsuura, et al.
U.S. Appl. No. 10/588,549, filed Aug. 7, 2006, Matsuura, et al.
U.S. Appl. No. 11/498,071, filed Aug. 3, 2006, Matsuura, et al.
U.S. Appl. No. 11/512,110, filed Aug. 30, 2006, Matsuura, et al.
U.S. Appl. No. 11/480,919, filed Jul. 6, 2006, Matsuura, et al.
U.S. Appl. No. 12/427,999, filed Apr. 22, 2009, Iwakuma, et al.
U.S. Appl. No. 12/755,240, filed Apr. 6, 2010, Iwakuma, et al.
U.S. Appl. No. 13/020,070, filed Feb. 3, 2011, Matsuura, et al.

* cited by examiner

ORGANIC ELECTROLUMINESCENCE DEVICE

BACKGROUND OF THE INVENTION

1. Field of the Invention

The invention relates to an organic electroluminescent device. In particular, the invention relates to a phosphorescent organic electroluminescent device.

2. Description of Related Art

An organic electroluminescent device (organic EL device) using an organic material is a promising solid-state emitting type inexpensive and large full-color display device, and has been extensively developed.

In general, when an electric field is applied between electrodes of an organic EL device, electrons are injected from the cathode and holes are injected from the anode. The electrons recombine with the holes in the emitting layer to produce an excited state, and the energy is emitted as light when the excited state returns to the ground state.

An organic EL device includes an emitting layer, a pair of opposing electrodes positioned on either side of the emitting layer, and a layer which transports holes or electrons to the emitting layer. As a specific example of the configuration of the organic EL device, a configuration including anode/hole transporting layer/emitting layer/electron transporting layer/cathode has been known. The hole transporting layer assists in transporting holes generated from the anode to the emitting layer, and the electron transporting layer assists in transporting electrons generated from the cathode to the emitting layer.

Patent document 1 discloses use of a compound having a carbazole group as a host material for the hole transporting layer (electron transporting layer) and the emitting layer. The patent document 1 utilizes a non-conjugated polymer compound for the hole transporting layer to obtain a device with a green emission of 371 m/W. However, the compound of the patent document 1 does not achieve a satisfactory luminous efficiency.

Patent document 2 utilizes a compound having a carbazole group for the hole transporting layer (electron transporting layer). Patent document 3 utilizes a compound having a carbazole group for the hole transporting layer and the emitting layer.

[Patent document 1] JP-A-2004-220931

[Patent document 2] JP-A-2002-203683

[Patent document 3] U.S. Pat. No. 6,863,997

An object of the invention is to provide a low-voltage, high-efficiency, and long-lived organic EL device.

SUMMARY OF THE INVENTION

According to the invention, the following organic EL device is provided.

1. An organic electroluminescent device comprising an anode, a cathode, and at least a first layer, a second layer, and a third layer provided between the anode and the cathode in that order from the anode side, at least one of the first to third layers including a phosphorescent compound, at least one of the first to third layers being an emitting layer, and at least three compounds respectively forming the first layer, the second layer, and the third layer other than the phosphorescent compound being compounds of the following formula (1),

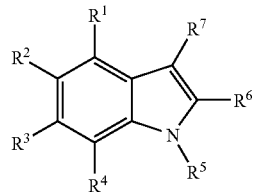

wherein $R^1$ to $R^7$ each represent a hydrogen atom or a substituent, provided that adjacent substituents may form a ring.

2. The organic electroluminescent device according to 1, wherein the compound of the formula (1) is a compound of the following formula (2),

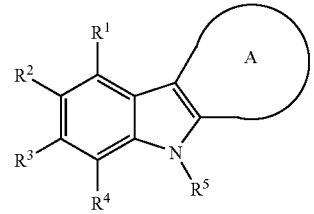

wherein $R^1$ to $R^5$ each represent a hydrogen atom or a substituent, and A represents a substituted or unsubstituted six to eight-membered aliphatic ring or aromatic ring which may contain a nitrogen atom, provided that adjacent substituents may form a ring.

3. The organic electroluminescent device according to 1 or 2, wherein the compound of the formula (1) or (2) is a compound of the following formula (3) or (4),

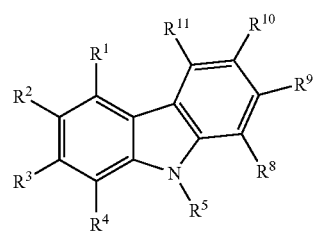

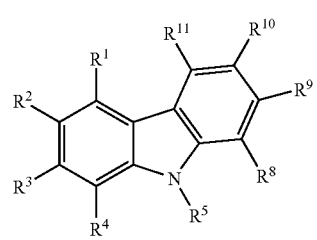

wherein $R^1$ to $R^5$ or $R^8$ to $R^{11}$ each represent a hydrogen atom or a substituent, provided that adjacent substituents may form a ring.

4. The organic electroluminescent device according to 3, wherein the compound forming the first layer and the compound forming the second layer are compounds of the formula (3) in which at least one of $R^1$ to $R^5$ and $R^8$ to $R^{11}$ is a substituent having an aromatic skeleton.

5. The organic electroluminescent device according to 4, wherein the compound forming the first layer is a compound of the formula (3) in which at least one of $R^1$ to $R^5$ and $R^8$ to $R^{11}$ has an aromatic group-substituted amino skeleton, and the compound forming the third layer is a compound of the formula (3) in which at least one of $R^1$ to $R^5$ and $R^8$ to $R^{11}$ has a nitrogen-containing aromatic five-membered ring, a nitrogen-containing aromatic six-membered ring, or a condensed ring of these rings.

6. The organic electroluminescent device according to 5, wherein the compound forming the third layer is a compound of the formula (3) in which at least one of $R^1$ to $R^5$ and $R^8$ to $R^{11}$ has a nitrogen-containing aromatic six-membered ring.

7. The organic electroluminescent device according to any one of 1 to 6, wherein the compounds of the formulas (1) to (4) are compounds which do not have a molecular weight distribution.

8. The organic electroluminescent device according to any one of 1 to 7, wherein at least two of the three compounds have a singlet energy level of 3.3 eV or more.

9. The organic electroluminescent device according to any one of 1 to 8, wherein at least two of the three compounds have a lowest triplet energy level of 2.7 eV or more.

10. The organic electroluminescent device according to any one of 1 to 9, wherein the phosphorescent compound has a lowest triplet energy level of 2.5 eV or more.

11. The organic electroluminescent device according to any one of 1 to 10, wherein the second layer is an emitting layer, and the first layer and the third layer contact the emitting layer.

According to the invention, an organic EL device can be provided which is driven at a low voltage and exhibits a high efficiency and a long lifetime.

In more detail, since different interactions between the organic layers can be reduced by introducing a common molecular group into the first layer, the emitting layer, and the second layer, a carrier mobility barrier between each organic layer can be reduced. Therefore, the device can be driven at a significantly reduced voltage, whereby a highly efficient device can be obtained.

DETAILED DESCRIPTION OF THE INVENTION AND PREFERRED EMBODIMENT

Figure 1:
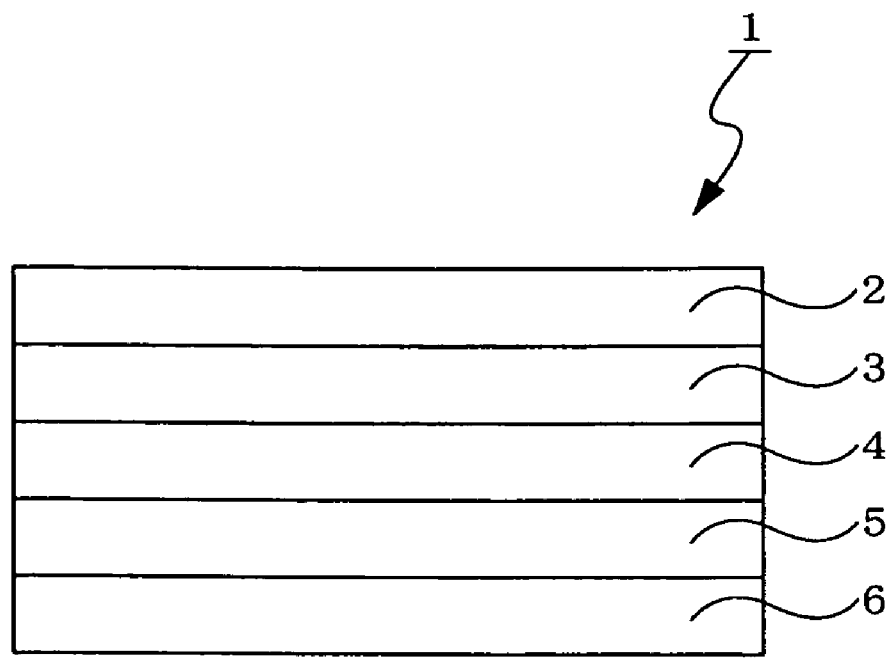
FIG. 1 is a cross-sectional view showing an embodiment of an organic EL device according to the invention.

An organic EL device according to the invention includes an anode, a cathode, and at least a first layer, a second layer, and a third layer provided between the anode and the cathode in that order from the anode side.

FIG. 1 is a view showing a configuration of an organic EL device according to one embodiment of the invention.

As shown in FIG. 1, an organic EL device 1 has a structure in which an anode 2, a first layer 3, a second layer 4, a third layer 5, and a cathode 6 are stacked.

At least one of the first layer 3, the second layer 4, and the third layer 5 includes a phosphorescent compound.

At least one of the first layer 3, the second layer 4, and the third layer 5 is an emitting layer. For example, one of the first layer 3, the second layer 4, and the third layer 5 may be an emitting layer. It is preferable that the second layer 4 be an emitting layer, and the emitting layer include a phosphorescent compound. Two or more of the first layer 3, the second layer 4, and the third layer 5 may be emitting layers. When two or more emitting layers are provided, it is preferable that at least one emitting layer include a phosphorescent compound.

As shown in FIG. 1, the first layer 3 and the third layer 5 preferably contact the second layer 4. Note that an intermediate layer may be provided between the first layer 3 and the second layer 4 or between the third layer 5 and the second layer 4. An intermediate layer may also be provided between the anode 2 and the first layer 3 or between the cathode 6 and the third layer 5.

When the first layer 3, the second layer 4, or the third layer 5 is not an emitting layer, the first layer 3 and/or the second layer 4 on the anode 2 side may be a layer having a hole transporting property such as a hole injecting layer or a hole transporting layer, and the second layer 4 and/or the third layer 5 on the cathode 6 side may be a layer having an electron transporting property such as an electron injecting layer or electron transporting layer.

The hole transporting layer, electron transporting layer, and emitting layer may include a phosphorescent compound.

In the invention, at least three compounds respectively forming the first layer, the second layer, and the third layer other than a phosphorescent compound are compounds of the following formula (1).

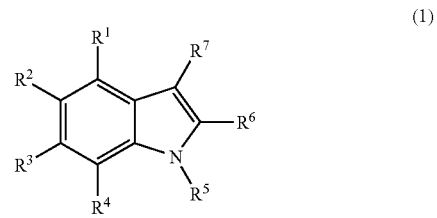

(1)

wherein $R^1$ to $R^7$ each represent a hydrogen atom or a substituent, provided that adjacent substituents may form a ring.

$R^6$ and $R^7$ form a ring to produce a compound of the following formula (2).

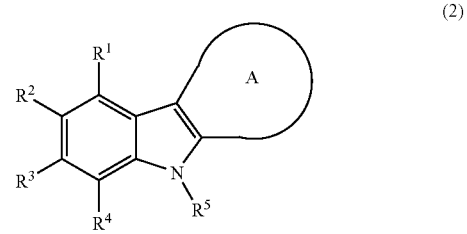

(2)

wherein $R^1$ to $R^5$ each represent a hydrogen atom or a substituent, and A represents a substituted or unsubstituted six to eight-membered aliphatic ring or aromatic ring which may contain a nitrogen atom, provided that adjacent substituents may form a ring.

A compound of the following formula (3) or (4) is preferable.

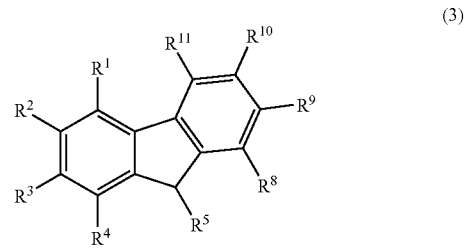

(3)

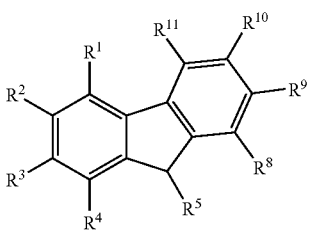

(4)

wherein $R^1$ to $R^5$ and $R^8$ to $R^{11}$ each represent a hydrogen atom or a substituent, provided that adjacent substituents may form a ring.

In the formulas (2) to (4), $R^1$ to $R^4$ and $R^8$ to $R^{11}$ are preferably a hydrogen atom, an alkyl group having 1 to 10 carbon atoms, an alkoxy group having 1 to 10 carbon atoms, a cyano group, an aryl group having 6 to 12 carbon atoms, or a halogenated alkyl group having 1 to 10 carbon atoms, and more preferably a hydrogen atom, and $R^5$ is a group having a nitrogen-containing aromatic skeleton. $R^5$ is preferably a group having an aromatic group-substituted tertiary amino skeleton, carbazole group, triazine ring and/or pyrimidine ring, and more preferably a group having an aromatic group-substituted tertiary amino skeleton, carbazole group, and/or pyrimidine ring.

The compound forming the first layer is preferably a compound of the formula (3) in which at least one of $R^1$ to $R^5$ and $R^8$ to $R^{11}$ has a nitrogen-containing aromatic skeleton.

The nitrogen-containing aromatic skeleton includes an aromatic group-substituted amino skeleton, a nitrogen-containing aromatic ring skeleton, and the like. The nitrogen-containing aromatic ring skeleton includes a nitrogen-containing aromatic five-membered ring, a nitrogen-containing aromatic six-membered ring, and a condensed ring of these rings.

Examples of the aromatic group-substituted amino skeleton and the nitrogen-containing aromatic six-membered ring are given below.

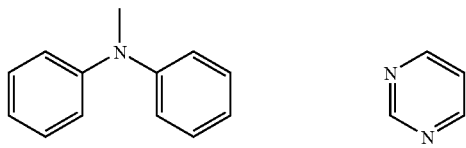

The compound forming the first layer is preferably a compound of the formula (3) in which $R^1$ to $R^4$ and $R^8$ to $R^{11}$ are a hydrogen atom, an alkyl group having 1 to 10 carbon atoms, an alkoxy group having 1 to 10 carbon atoms, a cyano group, an aryl group having 6 to 12 carbon atoms, or a halogenated alkyl group having 1 to 10 carbon atoms, and more preferably a hydrogen atom, and $R^5$ has a carbazole group and an aromatic group-substituted tertiary amino skeleton.

The compound forming the third layer is preferably a compound of the formula (3) in which at least one of $R^1$ to $R^5$ and $R^8$ to $R^{11}$ has a nitrogen-containing aromatic skeleton.

As described above, the nitrogen-containing aromatic ring skeleton includes a nitrogen-containing aromatic five-membered ring, a nitrogen-containing aromatic six-membered ring, and a condensed ring of these rings, and is preferably a nitrogen-containing aromatic six-membered ring.

The compound forming the third layer is preferably a compound of the formula (3) in which $R^1$ to $R^4$ and $R^8$ to $R^{11}$ are a hydrogen atom, an alkyl group having 1 to 10 carbon atoms, an alkoxy group having 1 to 10 carbon atoms, a cyano group, an aryl group having 6 to 12 carbon atoms, or a halogenated alkyl group having 1 to 10 carbon atoms, and more preferably a hydrogen atom, and $R^5$ has a pyrimidine ring, a pyridine ring, a triazine ring, or a nitrogen-containing condensed five or six-membered ring, and preferably a pyrimidine ring.

The compound forming the second layer is preferably a compound of the formula (3) in which at least one of $R^1$ to $R^5$ and $R^8$ to $R^{11}$ has a nitrogen-containing aromatic skeleton.

The nitrogen-containing aromatic ring skeleton includes a nitrogen-containing aromatic five-membered ring, a nitrogen-containing aromatic six-membered ring, and a condensed ring of these rings, and is preferably a condensed ring.

The compound forming the second layer is preferably a compound of the formula (3) in which $R^1$ to $R^4$ and $R^8$ to $R^{11}$ are a hydrogen atom, an alkyl group having 1 to 10 carbon atoms, an alkoxy group having 1 to 10 carbon atoms, a cyano group, an aryl group having 6 to 12 carbon atoms, or a halogenated alkyl group having 1 to 10 carbon atoms, and more preferably a hydrogen atom, and $R^5$ has a carbazole group, arylene group, or nitrogen-containing hetero ring, and preferably a carbazole group.

The compounds respectively forming the first and second layers or the first to third layers are preferably compounds of the formula (3) in which at least one of $R^1$ to $R^5$ and $R^8$ to $R^{11}$ has an aromatic skeleton. Particularly preferably, at least one of $R^1$ to $R^5$ and $R^8$ to $R^{11}$ has a nitrogen-containing aromatic skeleton.

It is preferable that the compound forming the first layer be a compound of the formula (3) in which at least one of $R^1$ to $R^5$ and $R^6$ to $R^{11}$ has an aromatic group-substituted amino skeleton, and the compound forming the third layer be a compound of the formula (3) in which at least one of $R^1$ to $R^5$ and $R^8$ to $R^{11}$ has a nitrogen-containing aromatic five-membered ring, a nitrogen-containing aromatic six-membered ring, or a condensed ring of these rings. It is particularly preferable that at least one of $R^1$ to $R^5$ and $R^8$ to $R^{11}$ of the compound forming the third layer has a nitrogen-containing aromatic six-membered ring.

It is more preferable that the three compounds forming the first layer, the second layer, and the third layer be compounds of the formula (3) in which $R^1$ to $R^4$ and $R^8$ to $R^{11}$ are a hydrogen atom, an alkyl group having 1 to 10 carbon atoms, an alkoxy group having 1 to 10 carbon atoms, a cyano group, an aryl group having 6 to 12 carbon atoms, or a halogenated alkyl group having 1 to 10 carbon atoms, and preferably a hydrogen atom, and $R^5$ has a nitrogen-containing aromatic skeleton. $R^5$ is preferably a group having an aromatic group-substituted amino skeleton, a carbazole group, and/or a pyrimidine ring. Specific preferred examples of the compound forming the first layer, the compound forming the second layer, and the compound forming the third layer have been described above.

It is preferable that the compounds of the formulas (1) to (4) be compounds which do not have a molecular weight distribution.

It is preferable that at least two of the compounds respectively forming the first layer, the second layer, and the third layer other than a phosphorescent compound have a singlet energy level of 3.3 eV or more, and preferably 3.4 eV or more. In this case, a blue phosphorescent device can be more efficiently caused to emit light.

It is preferable that at least two of the compounds respectively forming the first layer, the second layer, and the third layer other than a phosphorescent compound have a lowest triplet energy level of 2.7 eV or more, and preferably 2.8 eV or more. In this case, a blue phosphorescent device can be more efficiently caused to emit light.

It is preferable that the phosphorescent compound have a lowest excitation energy level of 2.5 eV or more, and preferably 2.6 eV or more. In this case, blue light with higher energy can be efficiently outcoupled.

The organic EL device according to the invention has a device structure in which three or more layers are stacked between the electrodes. The following structures can be given as examples of the device structure.
1. Anode, hole transporting layer, electron blocking layer, emitting layer, electron transporting layer, and cathode
2. Anode, hole transporting layer, emitting layer, hole blocking layer, electron transporting layer, and cathode
3. Anode, hole injecting layer, hole transporting layer, emitting layer, electron transporting layer, electron injecting layer, and cathode
4. Anode, hole transporting layer, electron blocking layer, emitting layer, electron transporting layer, electron injecting layer, and cathode
5. Anode, hole transporting layer, emitting layer, emitting layer, and cathode
6. Anode, emitting layer, emitting layer, electron transporting layer, and cathode
7. Anode, hole transporting layer, emitting layer, emitting layer, electron transporting layer, and cathode
8. Anode, hole transporting layer, electron blocking layer, emitting layer, and cathode
9. Anode, emitting layer, electron transporting layer, electron injecting layer, and cathode Each layer of the organic EL device according to the invention is described below in more detail.

The emitting layer has a function of allowing injection of holes from the anode or the hole injecting layer upon application of an electric field, a function of allowing injection of electrons from the cathode or the electron injecting layer, a function of allowing the injected charges (electrons and holes) to move due to the force of the electric field, and a function of allowing the electrons and the holes to recombine to emit light. The emitting layer of the organic EL device according to the invention preferably includes a phosphorescent compound and a host compound of which the guest compound is the phosphorescent compound.

The phosphorescent compound is not particularly limited insofar as the phosphorescent compound emits phosphorescence in the temperature range in which the device operates. It is preferable to select a compound with a lowest triplet energy level of 2.5 eV or more. As specific examples of such a compound, metal complexes such as Ir, Pt, Os, Pd, and Au complexes can be given. Of these, Ir and Pt complexes are preferable. Specific examples are given below.

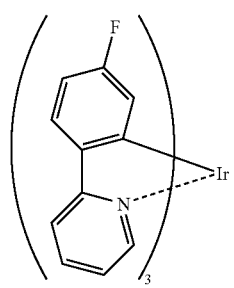

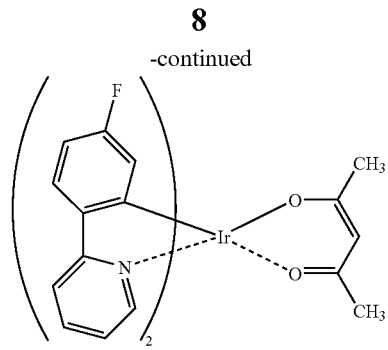

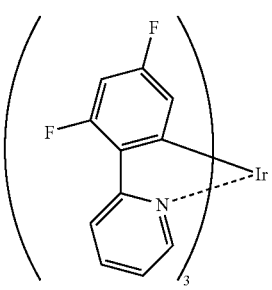

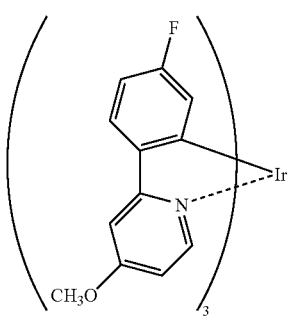

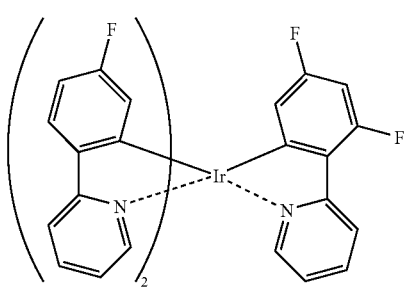

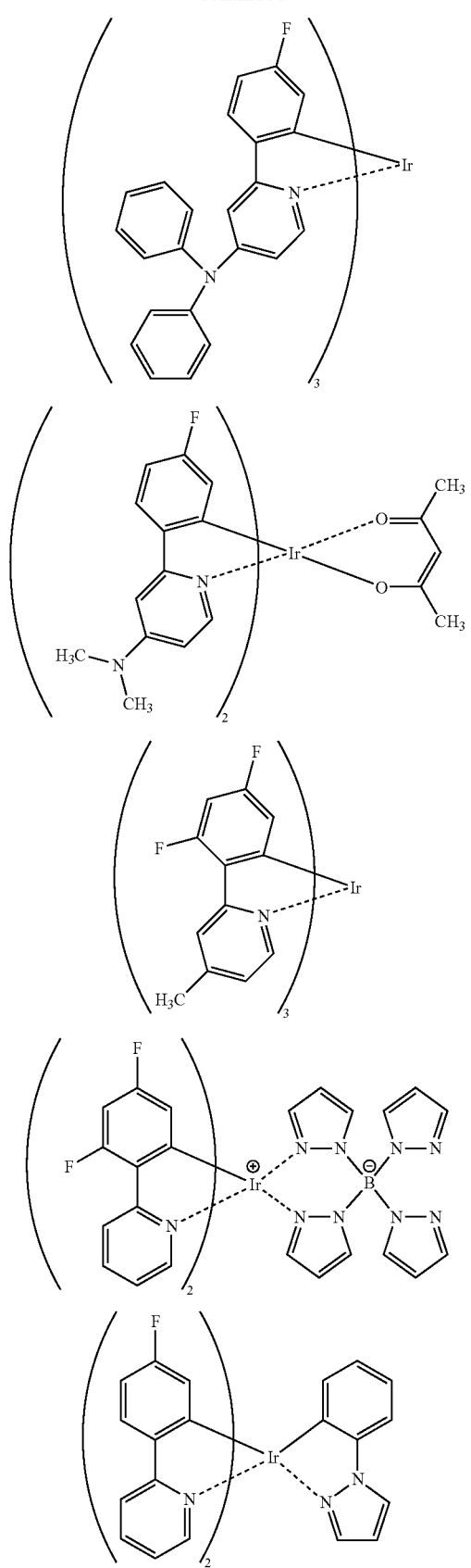
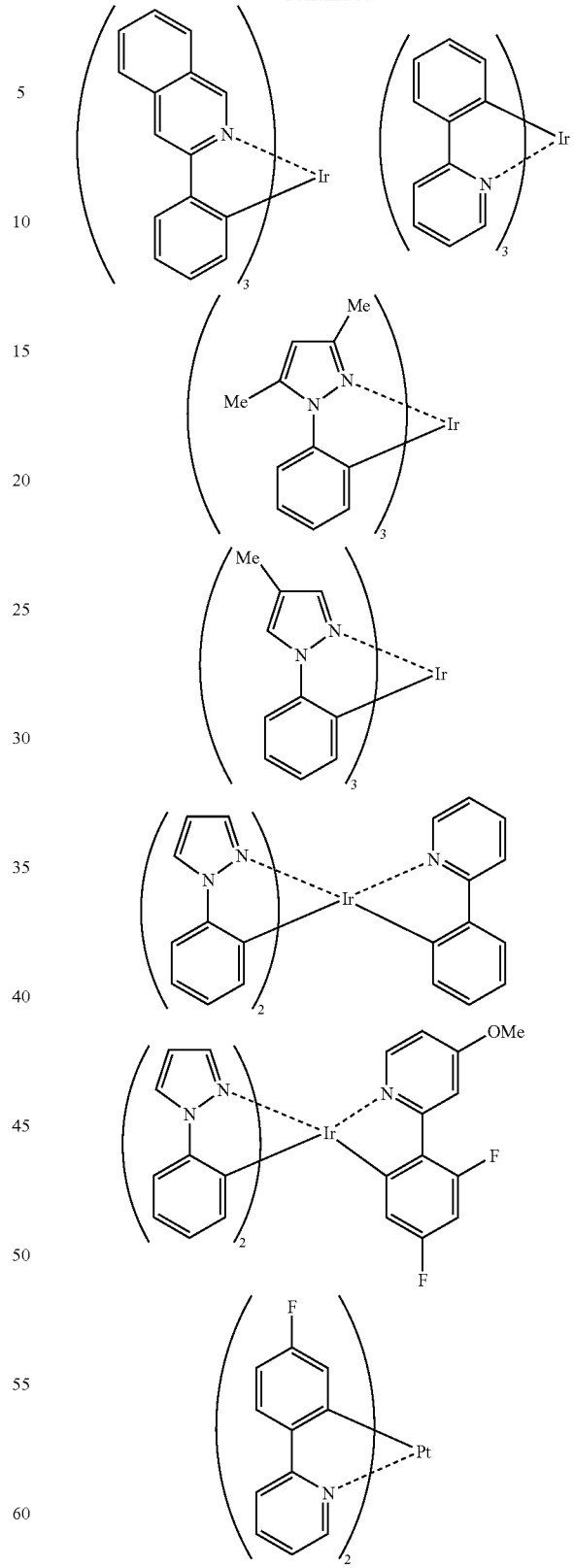
wherein Me indicates a methyl group.
As examples of the host compound of the formula (1), a compound having a substituted or unsubstituted indole group, a compound having a substituted or unsubstituted carbazole group, a compound having a substituted or unsubstituted azacarbazole group, and the like can be given. Specific examples of the host compound are given below.
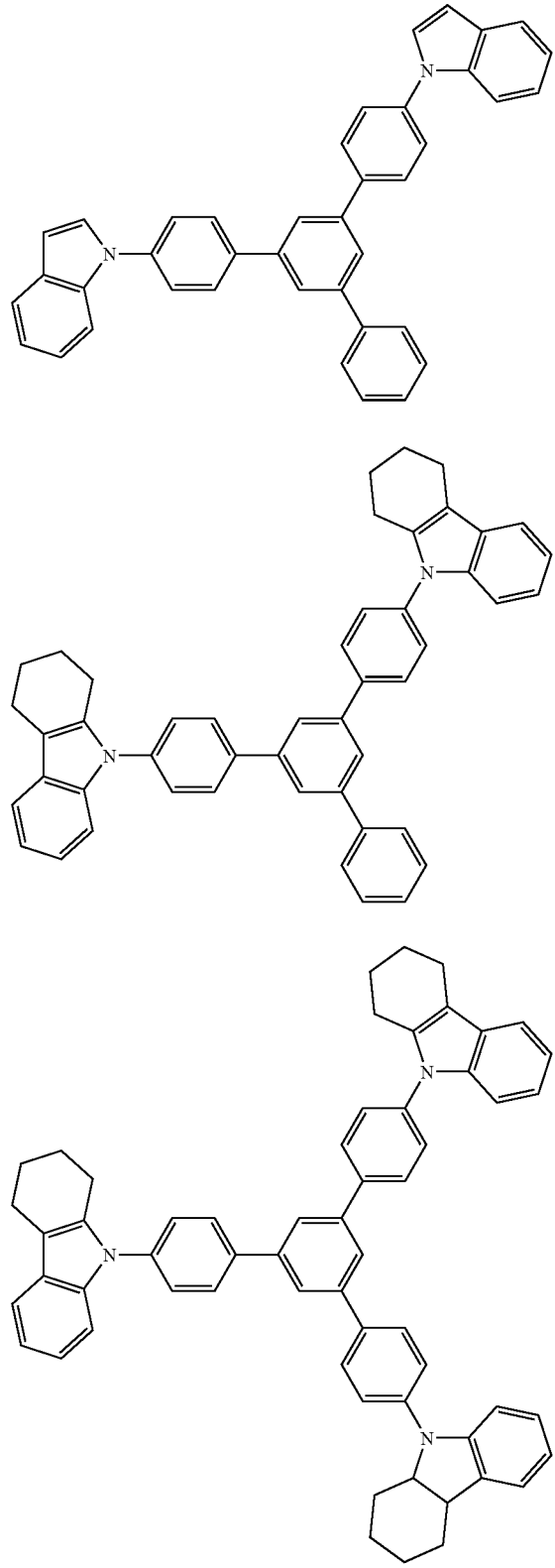
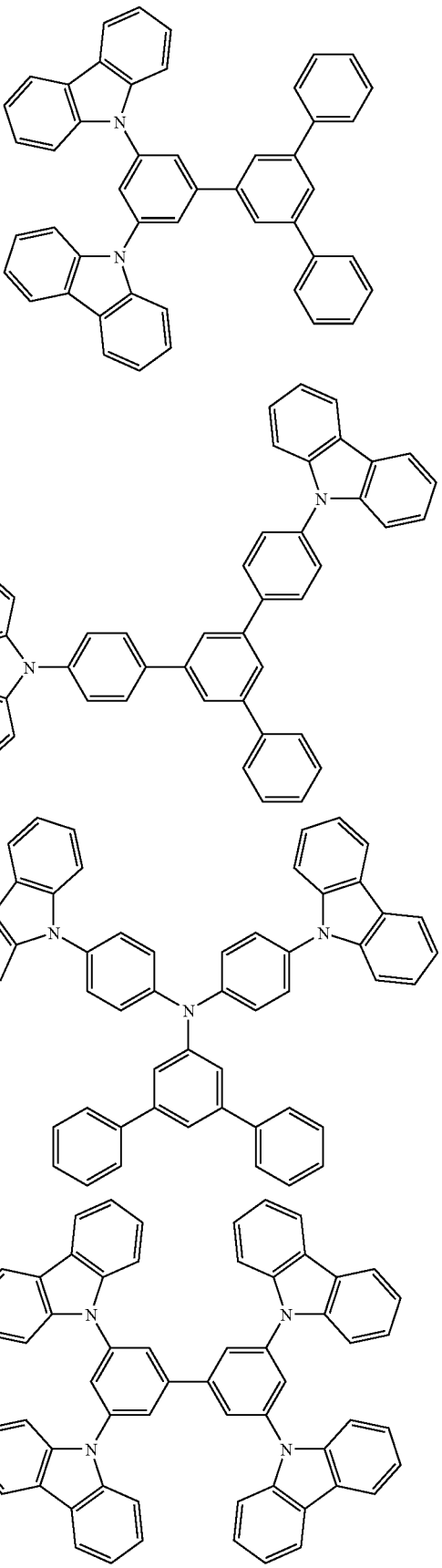

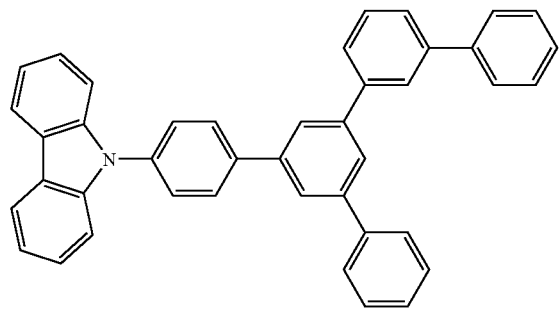
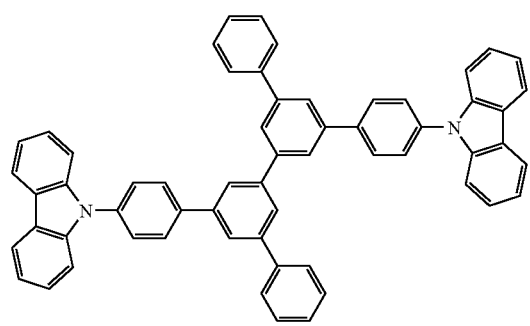
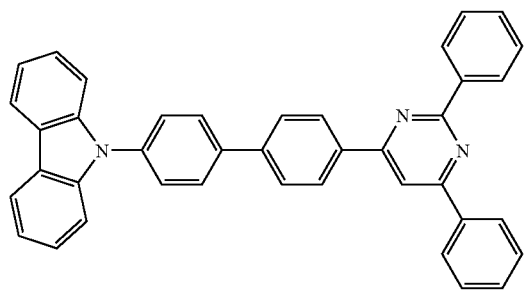
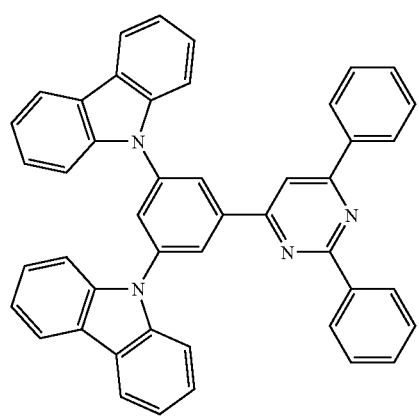
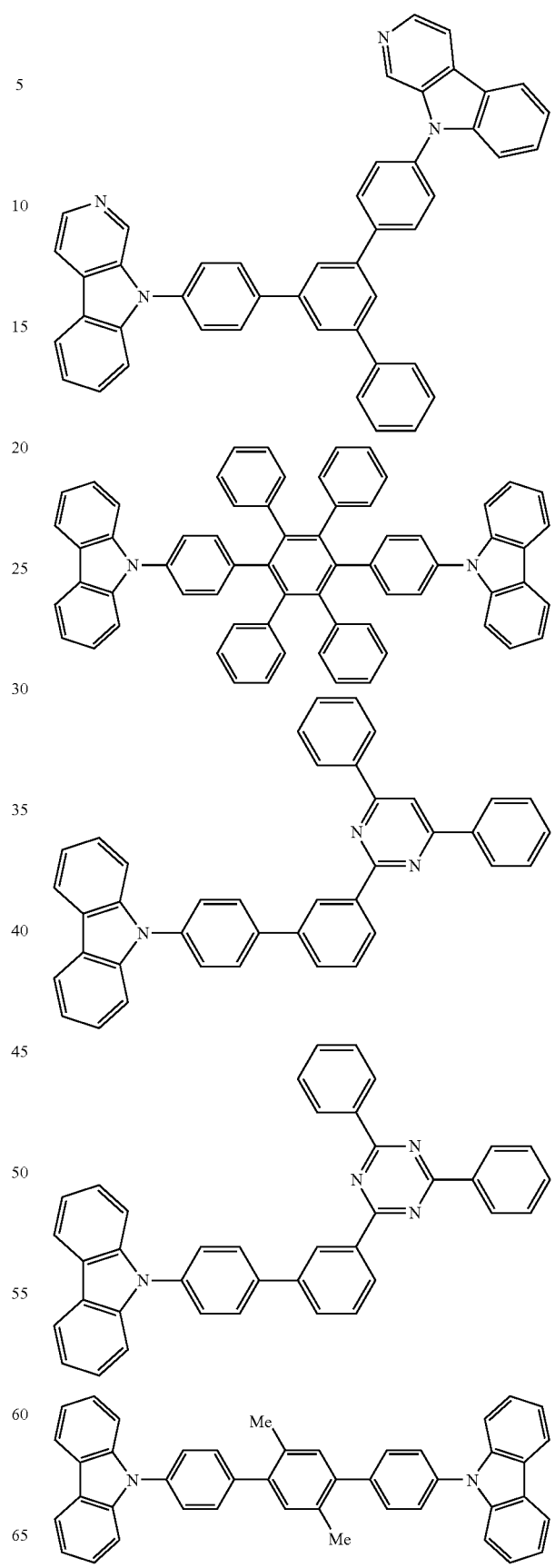

-continued

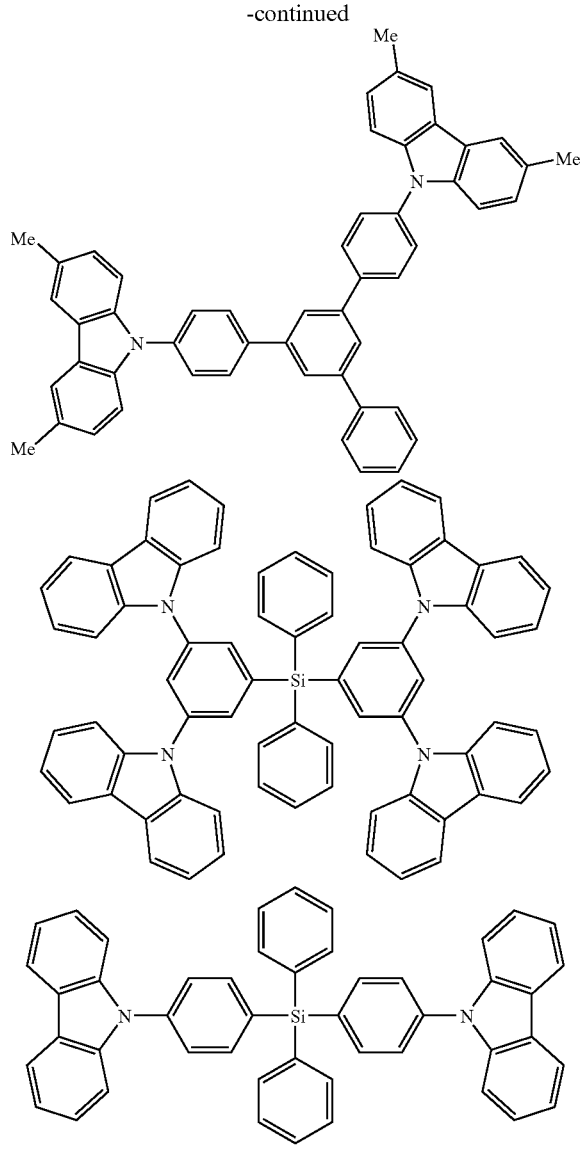

It is preferable that the $T_1$ level (energy level in the lowest triplet excited state) of the host compound be greater than the $T_1$ level of the guest compound.

The emitting layer is formed by codepositing the host compound and the phosphorescent compound, for example. This allows formation of an emitting layer in which the phosphorescent compound is doped with the host compound.

The hole injecting layer and the hole transporting layer are not limited insofar as these layers have one of a function of injecting holes from the anode, a function of transporting holes, and a function of blocking electrons injected from the cathode.

As specific examples of the compound of the formula (1) forming the hole injecting layer and the hole transporting layer, a compound having a substituted or unsubstituted indole skeleton, a compound having a substituted or unsubstituted carbazole skeleton, a compound having a substituted or unsubstituted azacarbazole skeleton, and the like can be given. As specific examples of the nitrogen-containing aromatic skeleton included in a preferred substituent, a carbazole skeleton, triazole skeleton, pyrazole skeleton, oxazole skeleton, oxadiazole skeleton, quinoxaline skeleton, imidazole skeleton, molecular skeleton in which these skeletons are condensed, phenylenediamine skeleton, arylamine skeleton, amino-substituted chalcone skeleton, aromatic tertiary amine skeleton, styrylamine skeleton, and the like can be given. These skeletons may be substituted or unsubstituted.

Specific examples of the hole transporting compound are given below.

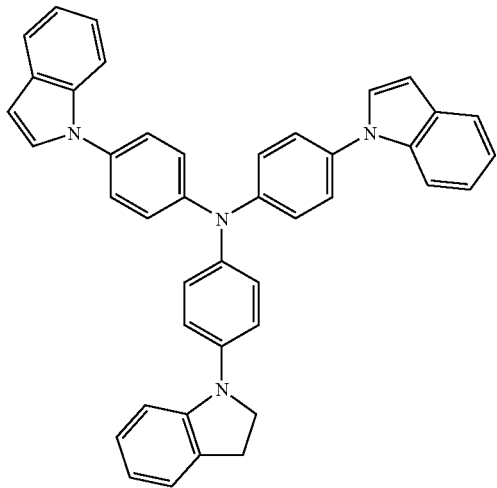

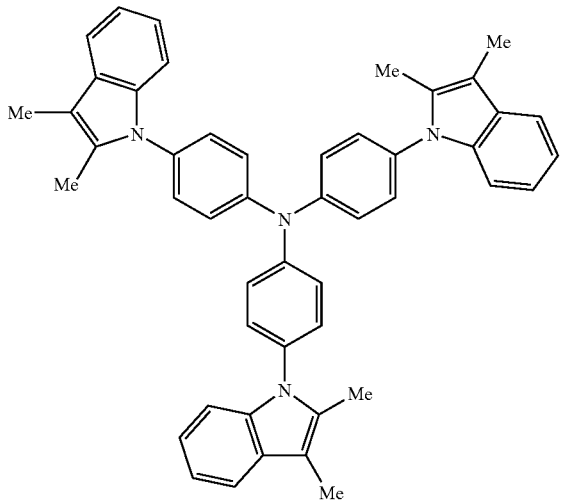

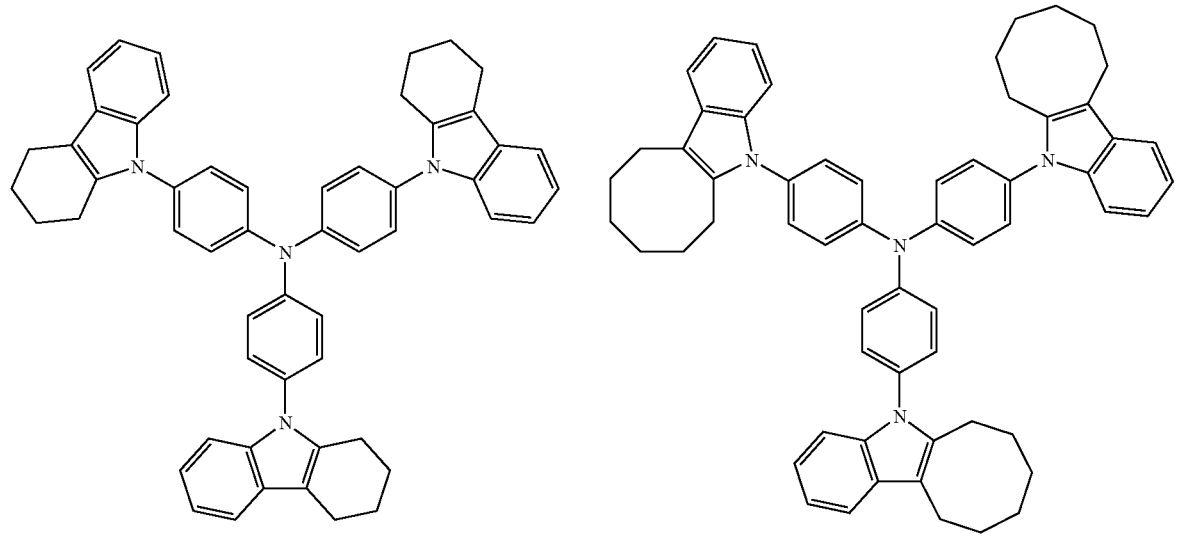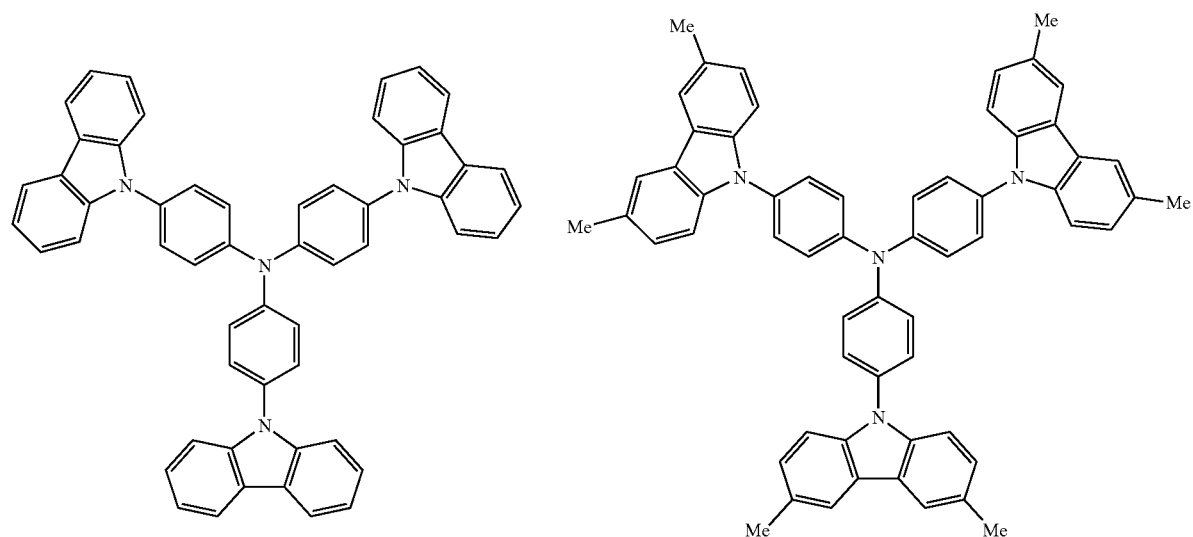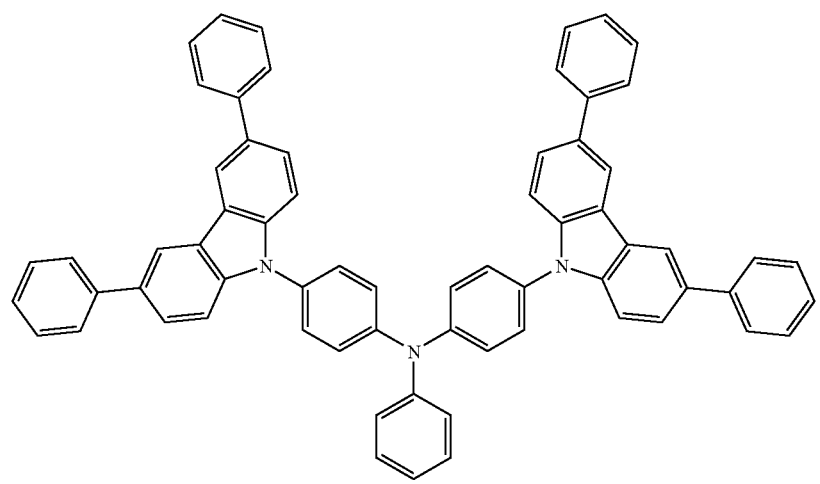

-continued
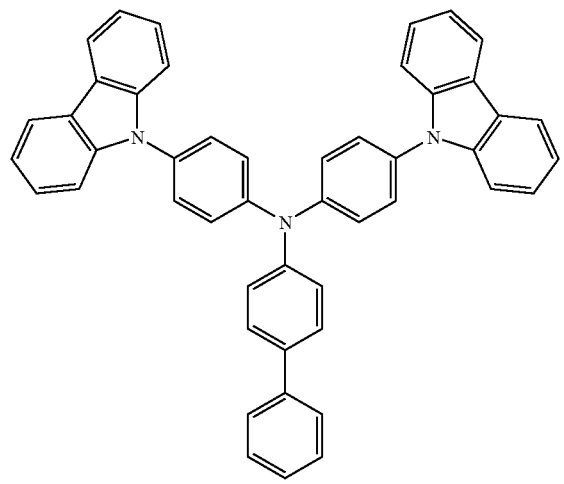
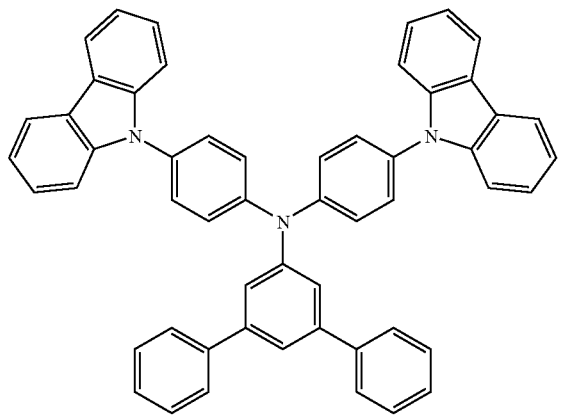
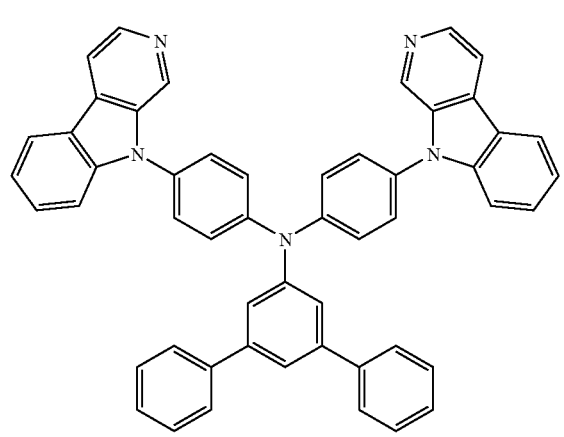
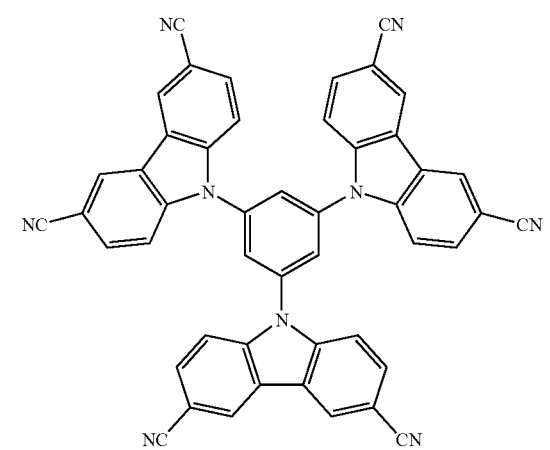
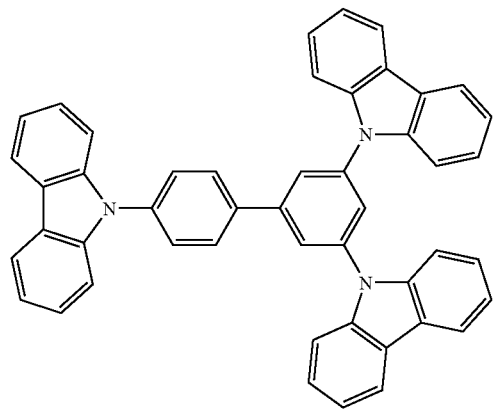
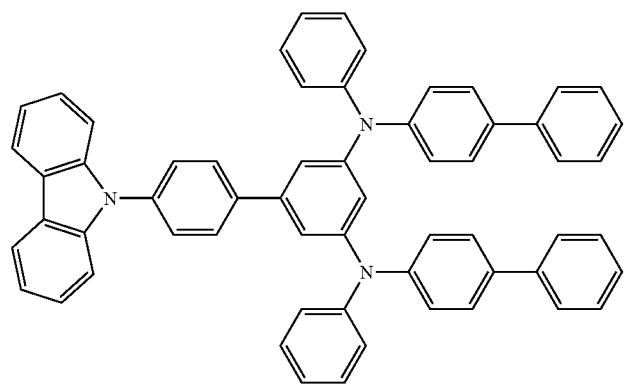

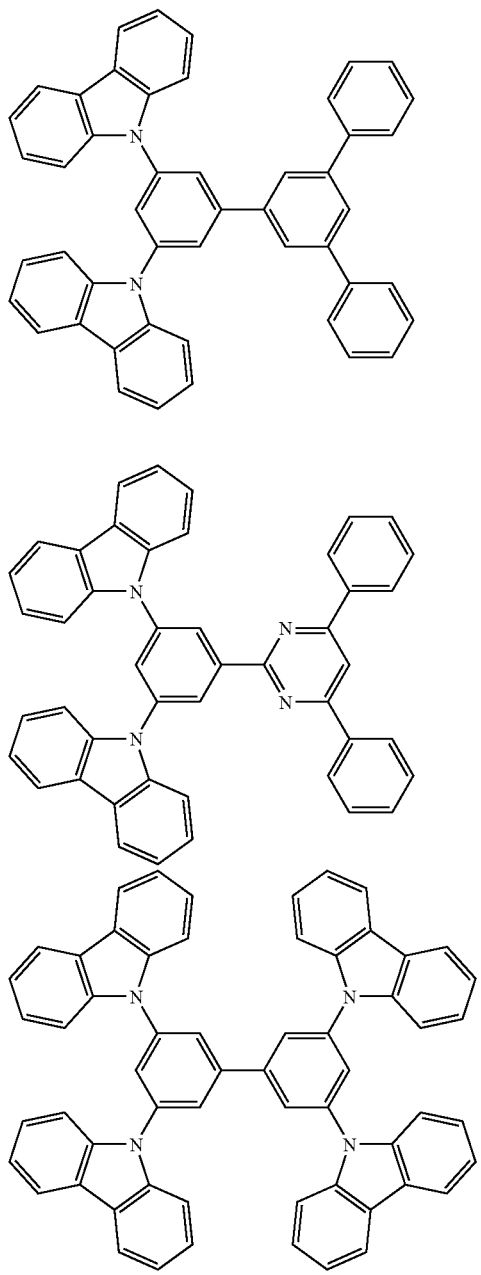
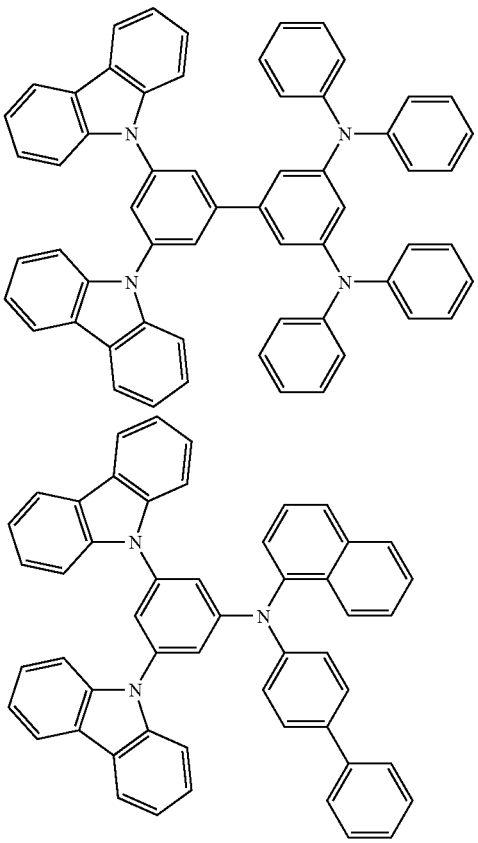
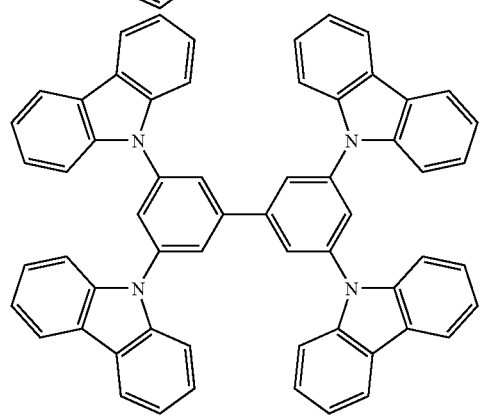

The hole injecting layer and the hole transporting layer may have a single-layer structure formed of only a layer of one, or two or more compounds selected from the above compounds, or may have a stacked structure including a layer of one, or two or more compounds selected from the above compounds.

The electron injecting layer and the electron transporting layer are not limited insofar as these layers have a function of injecting electrons from the cathode and a function of transporting electrons.

As specific examples of the compound of the formula (1) forming the electron injecting layer and the electron transporting layer, a compound having a substituted or unsubstituted indole skeleton, a compound having a substituted or unsubstituted carbazole skeleton, a compound having a substituted or unsubstituted azacarbazole skeleton, and the like can be given. As specific examples of the nitrogen-containing aromatic skeleton included in a preferred substituent, a pyridine skeleton, pyrimidine skeleton, pyrazine skeleton, triazine skeleton, triazole skeleton, oxadiazole skeleton, pyrazole skeleton, imidazole skeleton, carbazole skeleton, indole skeleton, azacarbazole skeleton, quinoxaline skeleton, pyrrole skeleton, molecular skeletons in which these skeletons are condensed, such as a benzimidazole skeleton and imidazopyridine skeleton, and the like can be given. Of these, a pyridine skeleton, pyrimidine skeleton, pyrazine skeleton, triazine skeleton, carbazole skeleton, indole skeleton, azacarbazole skeleton, and quinoxaline skeleton are preferable. The above skeletons may be substituted or unsubstituted.

Specific examples of the electron transporting compound are given below.

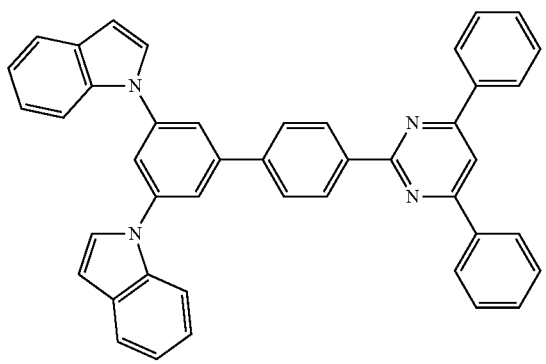
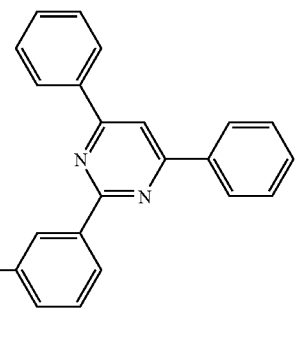
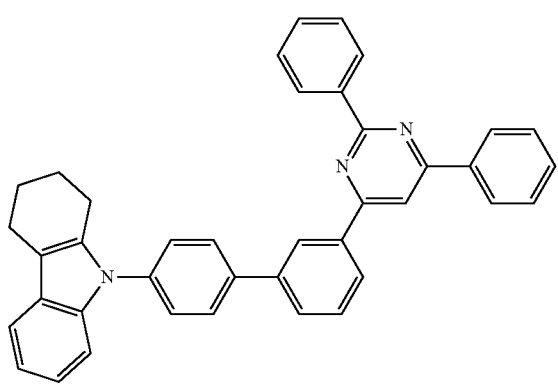
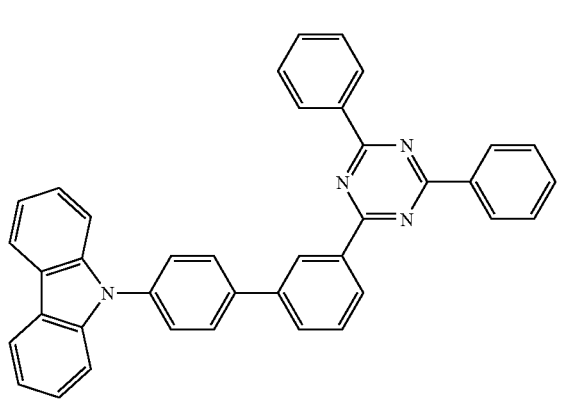
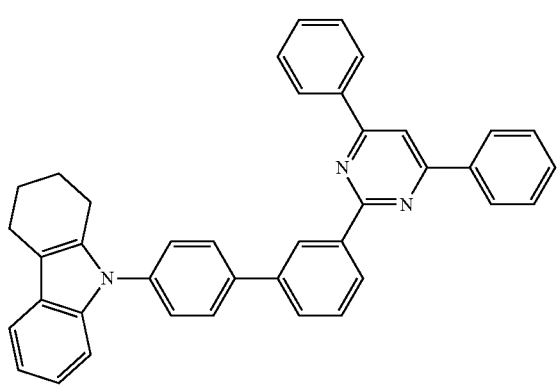
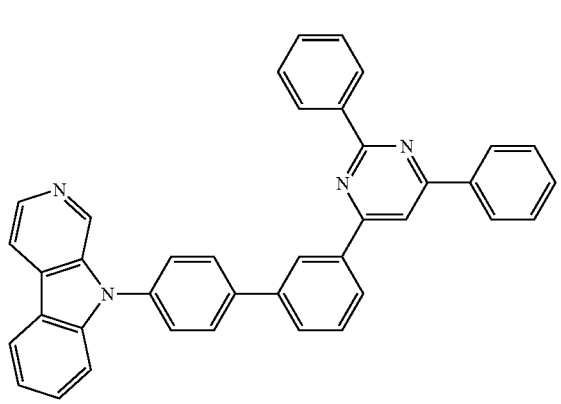
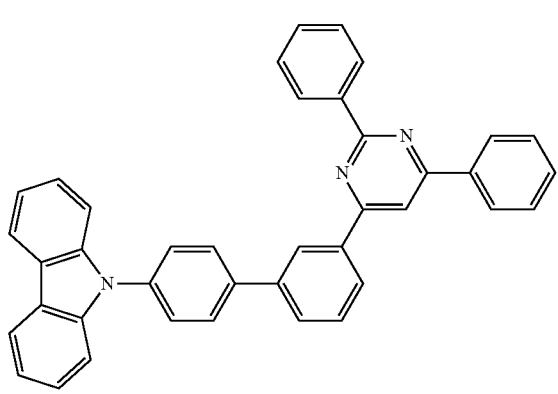
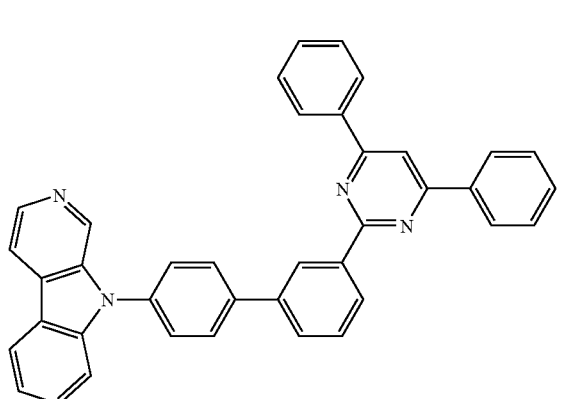

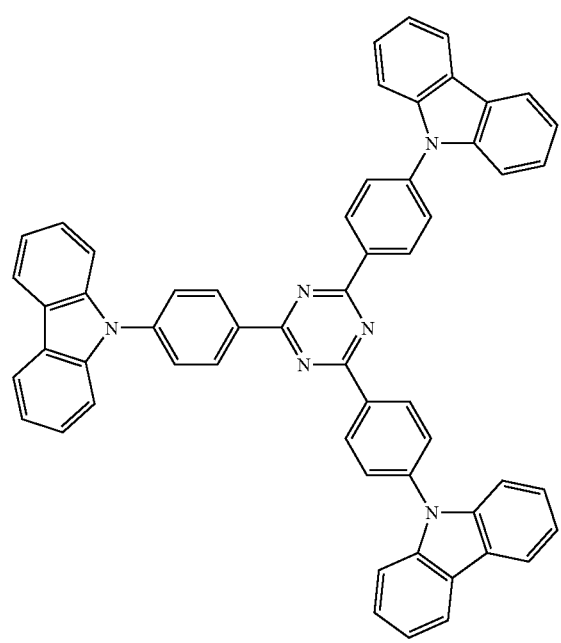
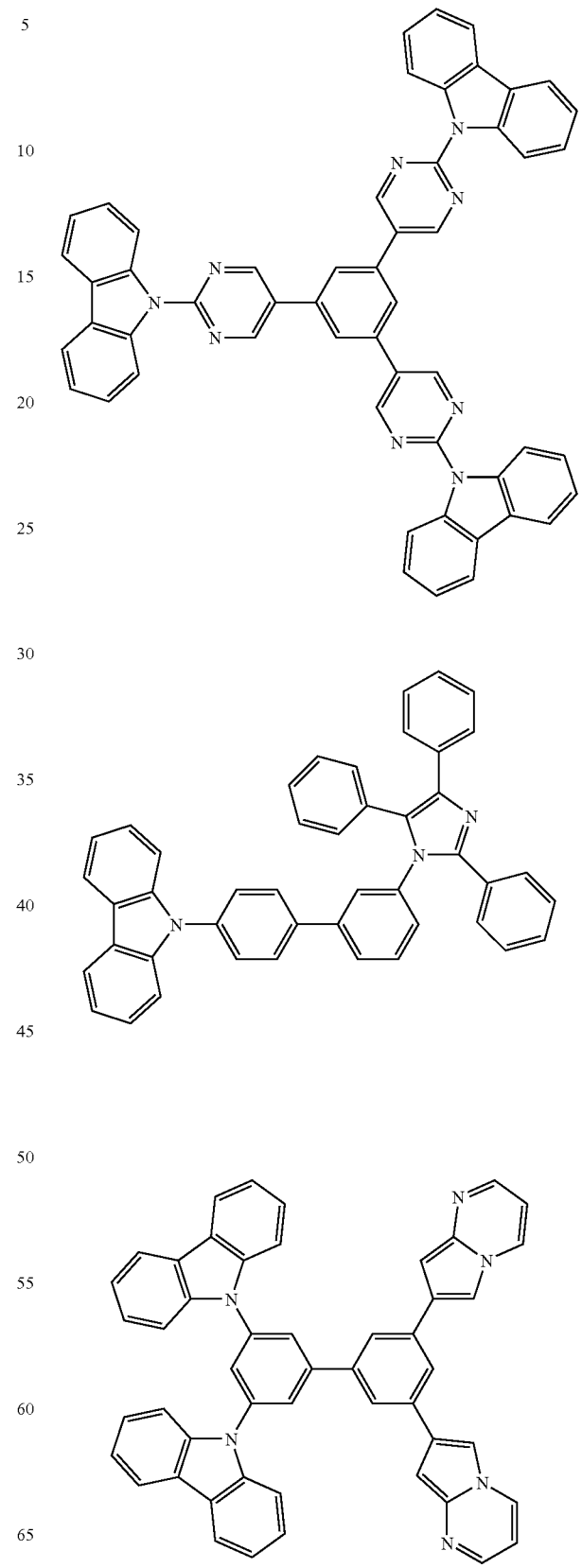

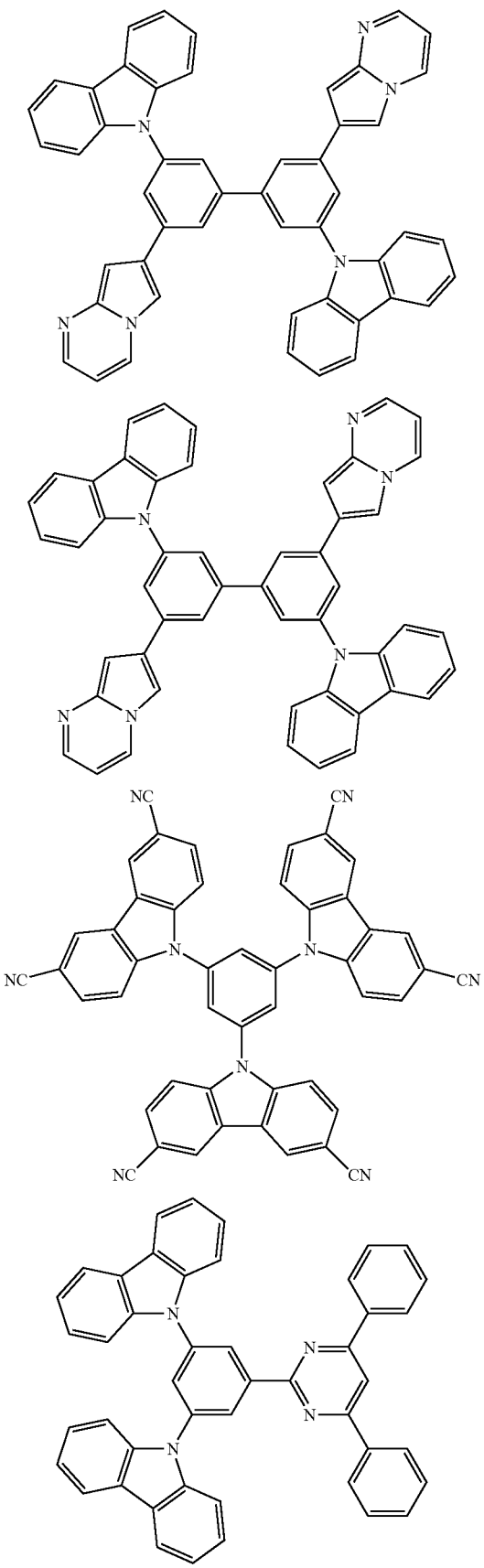
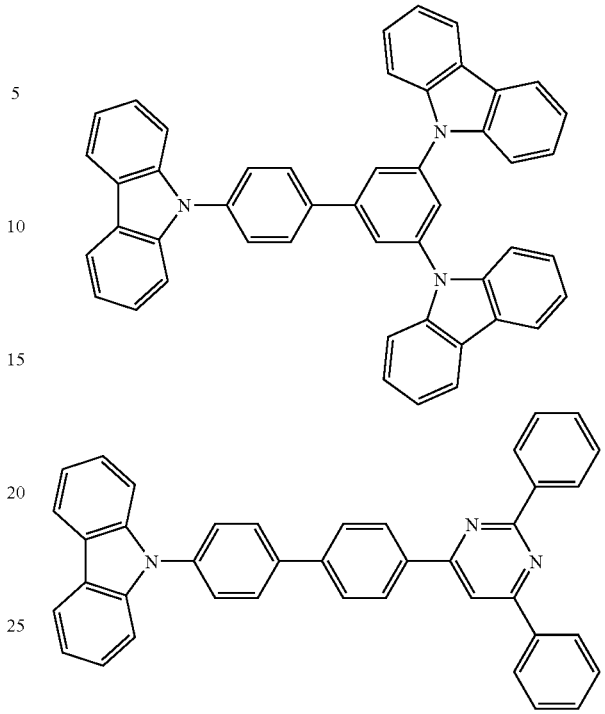

The electron injecting layer and the electron transporting layer may have a single-layer structure formed of one, or two or more of the above materials, or may have a multilayer structure formed of a plurality of layers of the same composition or different compositions.

A π electron deficient nitrogen-containing heterocyclic group is preferable.

In the organic EL device according to the invention, it is preferable to use an insulator or semiconductor inorganic compound as the material forming the electron injecting/transporting layer. If the electron injecting/transporting layer is formed of an insulator or a semiconductor, the electron injecting properties can be improved by effectively preventing leakage of current. As such an insulator, it is preferable to use at least one metal compound selected from the group consisting of an alkali metal chalcogenide, alkaline earth metal chalcogenide, alkali metal halide, and alkaline earth metal halide. If the electron injecting/transporting layer is formed of an alkali metal chalcogenide or the like, the electron injecting properties can be further improved.

As examples of preferred alkali metal chalcogenides, $Li_2O$, $Na_2S$, $Na_2Se$, and $Na_2O$ can be given. As examples of preferred alkaline earth metal chalcogenides, CaO, BaO, SrO, BeO, BaS, and CaSe can be given. As examples of preferred alkali metal halides, LiF, NaF, KF, LiCl, KCl, NaCl, and the like can be given. As examples of preferred alkaline earth metal halides, fluorides such as $CaF_2$, $BaF_2$, $SrF_2$, $MgF_2$, and $BeF_2$ and halides other than the fluorides can be given.

As examples of the semiconductor forming the electron injecting layer and the electron transporting layer, a single material or a combination of two or more of an oxide, nitride, or oxynitride containing at least one element selected from Ba, Ca, Sr, Yb, Al, Ga, In, Li, Na, Cd, Mg, Si, Ta, Sb, and Zn, and the like can be given. It is preferable that the inorganic compound forming the electron transporting layer be a microcrystalline or amorphous insulating thin film. If the electron transporting layer is formed of such an insulating thin film, a more uniform thin film is formed, whereby pixel defects such as dark spots can be reduced. As examples of such an inorganic compound, the above-mentioned alkali metal chalcogenide, alkaline earth metal chalcogenide, alkali metal halide, and alkaline earth metal halide can be given.

In the organic EL device according to the invention, the electron injecting layer and/or the electron transporting layer may include a reductive dopant with a work function of 2.9 eV or less. In the invention, the reductive dopant is a compound which increases electron injecting efficiency.

In the invention, it is preferable that the reductive dopant be added to the interfacial region between the cathode and the organic thin film layer so that the reductive dopant reduces the organic layer contained in the interfacial region to produce anions. A preferred reductive dopant is at least one compound selected from the group consisting of an alkali metal, alkaline earth metal oxide, alkaline earth metal, rare earth metal, alkali metal oxide, alkali metal halide, alkaline earth metal oxide, alkaline earth metal halide, rare earth metal oxide or halide, alkali metal complex, alkaline earth metal complex, and rare earth metal complex.

As examples of preferred reductive dopants, at least one alkali metal selected from the group consisting of Na (work function: 2.36 eV), K (work function: 2.28 eV), Rb (work function: 2.16 eV), and Cs (work function: 1.95 eV), and at least one alkaline earth metal selected from the group consisting of Ca (work function: 2.9 eV), Sr (work function: 2.0 to 2.5 eV), and Ba (work function: 2.52 eV) can be given. A material with a work function of 2.9 eV is particularly preferable. The reductive dopant is preferably at least one alkali metal selected from the group consisting of K, Rb, and Cs, more preferably Rb or Cs, and most preferably Cs. These alkali metals exhibit particularly high reducing capability so that an increase in the luminance and the lifetime of the organic EL device can be achieved by adding a relatively small amount of alkali metal to the electron injection region.

As the alkaline earth metal oxide, BaO, SrO, CaO, and $Ba_xSr_{1-x}O$ (0<x<1), and $Ba_xCa_{1-x}O$ (0<x<1) as mixtures thereof are preferable. As examples of the alkali oxide or alkali fluoride, LiF, $Li_2O$, NaF, and the like can be given. The alkali metal complex, alkaline earth metal complex, and rare earth metal complex are not particularly limited insofar as the complex contains at least one of an alkali metal ion, alkaline earth metal ion, and rare earth metal ion as the metal ion.

As examples of the ligand, quinolinol, benzoquinolinol, acridinol, phenanthridinol, hydroxyphenyloxazole, hydroxyphenylthiazole, hydroxydiaryloxadizole, hydroxydiarylthiadiazole, hydroxyphenylpyridine, hydroxyphenylbenzimidazole, hydroxybenzotriazole, hydroxyfurborane, bipyridyl, phenanthroline, phthalocyanine, porphyrin, cyclopentadiene, β-diketone, azomethine, derivatives thereof, and the like can be given. Note that the ligand is not limited thereto.

The reductive dopant is preferably formed in the shape of a layer or islands. The thickness of the reductive dopant is preferably 0.05 to 8 nm when used in the shape of a layer.

As the method of forming the electron injecting layer and the electron transporting layer including the reductive dopant, a method is preferable in which an organic material which is the emitting material or the electron injecting material which forms the interfacial region is deposited while depositing the reductive dopant by resistance heating deposition to disperse the reductive dopant in the organic material. The dispersion concentration (molar ratio) is 100:1 to 1:100, and preferably 5:1 to 1:5. When forming the reductive dopant in the shape of a layer, the emitting material or the electron injecting material which is the organic layer at the interface is formed in the shape of a layer, and the reductive dopant is deposited alone by resistance heating deposition to a thickness of preferably 0.5 to 15 nm. When forming the reductive dopant in the shape of islands, after forming the emitting material or the electron injecting material which is the organic layer at the interface, the reductive-dopant is deposited alone by resistance heating deposition to a thickness of preferably 0.05 to 1 nm.

The anode supplies holes to the hole injecting layer, the hole transporting layer, the emitting layer, and the like. It is effective that the anode have a work function of 4.5 eV or more. As a compound for forming the anode, a metal, alloy, metal oxide, conductive compound, a mixture of these materials, or the like may be used. As specific examples of the compound for forming the anode, conductive metal oxides such as tin oxide, zinc oxide, indium oxide, and tin-doped indium oxide (ITO), metals such as gold, silver, chromium, and nickel, a mixture or a stacked product of the conductive metal oxide and the metal, inorganic conductive substances such as copper iodide and copper sulfide, organic conductive materials such as polyaniline, polythiophene, and polypyrrole, a stacked product of the conductive material and ITO, and the like can be given. Of these, the conductive metal oxide is preferable. In particular, it is preferable to use ITO from the viewpoint of productivity, conductivity, transparency, and the like. The thickness of the anode may be appropriately selected.

The cathode supplies electrons to the electron injecting layer, the electron transporting layer, the emitting layer, and the like. As a compound for forming the cathode, a metal, alloy, metal halide, metal oxide, conductive compound, or a mixture of these materials may be used. As specific examples of the material for the cathode, alkali metals (e.g. Li, Na, and K) and fluorides or oxides thereof, alkaline earth metals (e.g. Mg and Ca) and fluorides or oxides thereof, gold, silver, lead, aluminum, sodium-potassium alloy or sodium-potassium mixed metal, lithium-aluminum alloy or lithium-aluminum mixed metal, magnesium-silver alloy or magnesium-silver mixed metal, rare earth metals such as indium and ytterbium, and the like can be given. Of these, aluminum, lithium-aluminum alloy or lithium-aluminum mixed metal, magnesium-silver alloy or magnesium-silver mixed metal, and the like are preferable. The cathode may have a single-layer structure formed of only a layer of one, or two or more compounds selected from the above compounds, or may have a stacked structure including a layer of one, or two or more compounds selected from the above compounds. For example, a stacked structure of aluminum/lithium fluoride or aluminum/lithium oxide is preferable. The thickness of the cathode may be appropriately selected.

In the organic EL device according to the invention, the formation method for each layer is not particularly limited. Various methods may be utilized such as vacuum evaporation, LB method, resistance heating deposition, electron beam method, sputtering, molecular stack method, coating (spin coating, casting, dip coating and the like), inkjet-method, and printing.

An organic thin film layer including a metal complex compound may be formed using a known method such as vacuum deposition, molecular beam epitaxy (MBE), or a coating method using a solution in which the material is dissolved in a solvent, such as dipping, spin coating, casting, bar coating, or roll coating.

In the above coating method, the metal complex compound is dissolved in a solvent to prepare a coating liquid, and the coating liquid is applied to and dried on a desired layer (or electrode). A resin may be added to the coating liquid. The resin may be dissolved or dispersed in the solvent. As the resin, a non-conjugated polymer (e.g. polyvinylcarbazole) or a conjugated polymer (e.g. polyolefin polymer) may be used. As examples of the resin, polyvinyl chloride, polycarbonate, polystyrene, polymethylmethacrylate, polybutyl methacrylate, polyester, polysulfone, polyphenylene oxide, polybutadiene, poly(N-vinylcarbazole), hydrocarbon resin, ketone resin, phenoxy resin, polyamide, ethyl cellulose, vinyl acetate, ABS resin, polyurethane, melamine resin, unsaturated polyester resin, alkyd resin, epoxy resin, silicon resin, and the like can be given.

The thickness of each organic layer of the organic EL device according to the invention is not particularly limited. In general, defects such as pinholes tend to occur when the thickness is too small, and a high voltage must be applied when the thickness is too great, resulting in poor efficiency. Therefore, the thickness of each organic layer is preferably several nanometers to 1 μm.

EXAMPLES

Compounds of the following formulas were used in the examples and comparative examples. The characteristics of these compounds were measured using the following methods. The results are shown in Table 1.

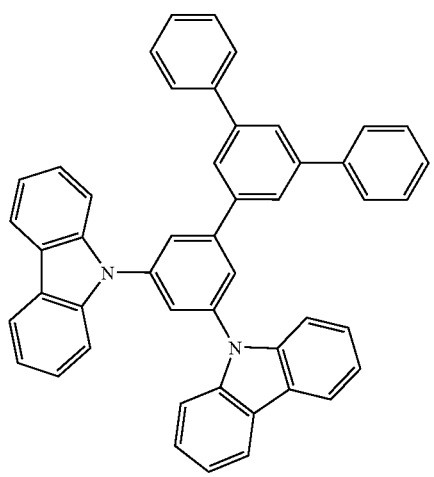

TCTA

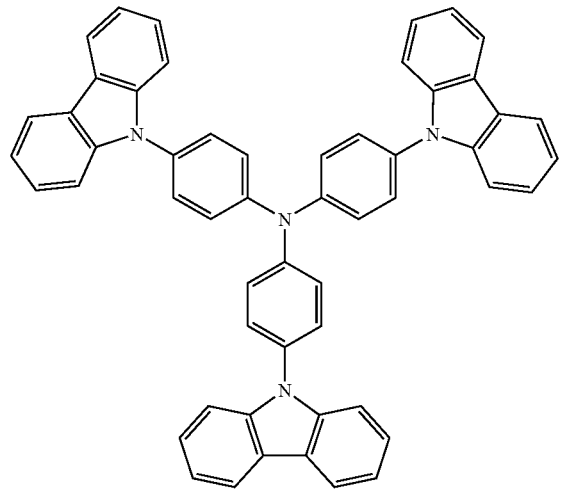

Compound (A)

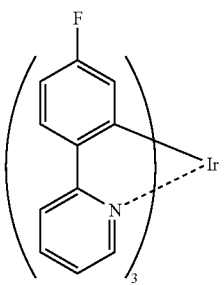

Compound (B)

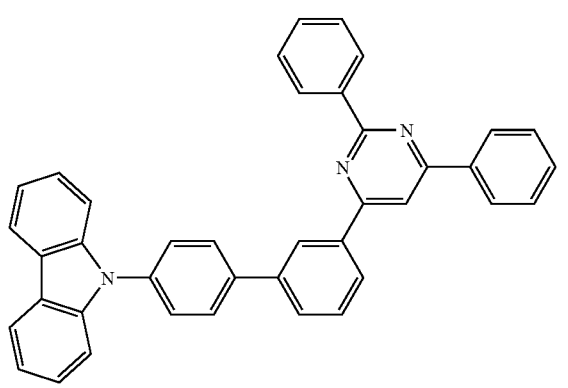

Compound (C)

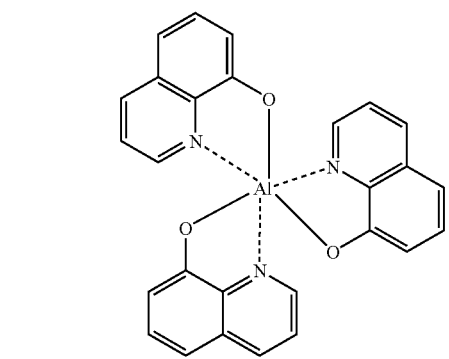

Alq$_3$

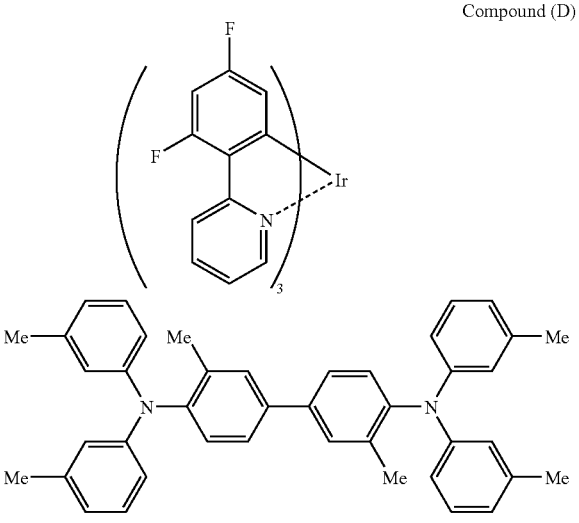

Compound (D)

HMTPD

-continued

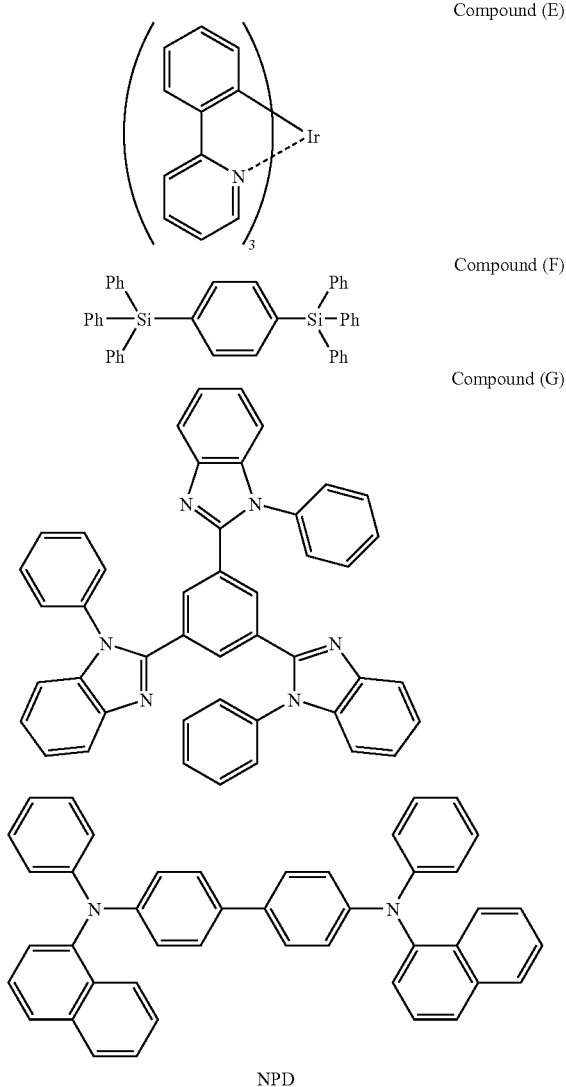

Compound (E)

Compound (F)

Compound (G)

NPD wherein Me indicates methyl, and Ph indicates phenyl.

(1) Ionization Potential

A thin film of each material was formed, and the ionization potential of the thin film was measured using an "AC-1" manufactured by Riken Keiki Co., Ltd.

A glass substrate was subjected to ultrasonic cleaning for five minutes in isopropyl alcohol, five minutes in water, and five minutes in isopropyl alcohol, and then subjected to UV cleaning for 30 minutes. A film of a measurement target material was formed on the glass substrate using a vacuum deposition device. The film was formed to a thickness of 2000 angstroms using an "SGC-8MII" manufactured by Showa Shinku Co., Ltd. at a final vacuum of $5.3 \times 10^{-4}$ Pa or less and a deposition rate of 2 angstroms/sec.

The ionization potential was measured using an atmospheric photoelectron spectrometer ("AC-1" manufactured by Riken Keiki Co., Ltd.). Light obtained by dispersing ultraviolet rays from a deuterium lamp using a spectroscope was applied to the thin film sample, and the emitted photoelectrons were measured using an open counter. The intersection of the background and the square root of the quantum yield in the photoelectron spectrum in which the square root of the quantum yield was plotted along the vertical axis and the energy of applied light was plotted along the horizontal axis was taken as the ionization potential.

(2) Singlet Energy Level

The compound was dissolved in toluene to obtain a $10^{-5}$ mol/l solution. The absorption spectrum was measured using a spectro-photometer ("U3410" manufactured by Hitachi, Ltd.). A line tangent to the UV absorption spectrum was drawn at the rising edge on the longer wavelength side, and the wavelength (absorption edge) at which the tangent line intersects the horizontal axis was determined. This wavelength was converted into an energy value to determine the energy level.

(3) Triplet Energy Level

The lowest triplet energy level $T_1$ was measured as follows. The lowest triplet energy level $T_1$ was measured using a Fluorolog II manufactured by SPEX at a concentration of 10 micromol/l and a temperature of 77K using EPA (diethyl ether:isopentane:isopropyl alcohol=5:5:2 (volume ratio)) as a solvent utilizing a quartz cell. A line tangent to the resulting phosphorescence spectrum was drawn at the rising edge on the shorter wavelength side, and the wavelength (emission edge) at which the tangent line intersects the horizontal axis was determined. This wavelength was converted into an energy value.

TABLE 1

| Compound | Ionization potential (eV) | Singlet energy level (eV) | Lowest triplet energy level (eV) |
|---|---|---|---|
| TCTA | 5.8 | 3.3 | 2.9 |
| Compound (A) | 6.0 | 3.6 | 2.9 |
| Compound (B) | 5.7 | — | 2.6 |
| Compound (C) | 6.0 | 3.9 | 2.9 |
| Compound (D) | 5.8 | — | 2.7 |
| Compound (E) | 5.3 | — | 2.4 |
| Alq$_3$ | 5.8 | 2.7 | — |
| HMTPD | 5.6 | 3.3 | 2.6 |
| NPD | 5.5 | 3.0 | 2.4 |
| Compound (F) | 7.1 | 4.3 | 3.5 |
| Compound (G) | 5.8 | 3.3 | 2.9 |

Example 1

A glass substrate with an ITO transparent electrode (25 mm×75 mm×0.7 mm) was subjected to ultrasonic cleaning in isopropyl alcohol for five minutes and then subjected to UV ozone cleaning for 30 minutes. The cleaned glass substrate with the transparent electrode was installed in a substrate holder of a vacuum deposition device, and a TCTA film with a thickness of 95 nm was formed on the surface of the glass substrate on which the transparent electrode was formed so that the transparent electrode was covered with the TCTA film. The TCTA film functions as a hole transporting layer. The compound (A) was deposited on the TCTA film as a host compound to a thickness of 30 nm to form an emitting layer. The Ir metal complex compound (B) was added as a phosphorescent Ir metal complex dopant. The concentration of the metal complex compound (B) in the emitting layer was adjusted to 7.5 wt %. This film functions as an emitting layer. The compound (C) was formed on this film to a thickness of 25 nm. This film functions as an electron transporting layer. An Alq$_3$ film was formed on this film to a thickness of 5 nm. This film functions as an electron transporting layer. Lithium fluoride was then deposited to a thickness of 0.1 nm, and aluminum was deposited to a thickness of 150 nm. This Al/LiF film functions as a cathode. An organic EL device was fabricated.

After sealing the resulting device, electricity was supplied to the device. Blue green light with a luminance of 114 cd/m² was obtained at a voltage of 5.5 V and a current density of 0.28 mA/cm². The luminous efficiency was 41 cd/A. The device was driven at a constant current and an initial luminance of 200 cd/m². The period of time until the luminance was halved to 100 cd/m² was measured and found to be 2050 hours.

Example 2

An organic EL device was fabricated in the same manner as in Example 1 except for using the compound (D) instead of the compound (B). After sealing the resulting device, electricity was supplied to the device in the same manner as in Example 1.

Blue green light with a luminance of 113 cd/m² was obtained at a voltage of 5.5 V and a current density of 0.35 mA/cm². The luminous efficiency was 32 cd/A. The device was driven at a constant current and an initial luminance of 200 cd/m². The period of time until the luminance was halved to 100 cd/m² was measured and found to be 730 hours.

Example 3

An organic EL device was fabricated in the same manner as in Example 1 except for using the compound (E) instead of the compound (B). After sealing the resulting device, electricity was supplied to the device in the same manner as in Example 1.

Green light with a luminance of 108 cd/m² was obtained at a voltage of 5.5 V and a current density of 0.14 mA/cm². The luminous efficiency was 77 cd/A and 44 lm/W. The device was driven at a constant current and an initial luminance of 1500 cd/m². The period of time until the luminance was halved to 750 cd/m² was measured and found to be 3210 hours.

Comparative Example 1

An organic EL device was fabricated in the same manner as in Example 1 except for using HMTPD instead of TCTA.

After sealing the resulting device, electricity was supplied to the device in the same manner as in Example 1.

Blue green light with a luminance of 106 cd/m² was obtained at a voltage of 7.4 V and a current density of 0.92 mA/cm². The luminous efficiency was 12 cd/A. The device was driven at a constant current and an initial luminance of 200 cd/m². The period of time until the luminance was halved to 100 cd/m² was measured and found to be 298 hours.

Comparative Example 2

An organic EL device was fabricated in the same manner as in Example 1 except for using NPD instead of TCTA.

After sealing the resulting device, electricity was supplied to the device in the same manner as in Example 1.

Blue green light with a luminance of 100 cd/m² was obtained at a voltage of 7.3 V and a current density of 1.50 mA/cm². The luminous efficiency was 6 cd/A. The device was driven at a constant current and an initial luminance of 200 cd/m². The period of time until the luminance was halved to 100 cd/m² was measured and found to be 380 hours.

Comparative Example 3

An organic EL device was fabricated in the same manner as in Example 1 except for using the compound (F) instead of the compound (A).

After sealing the resulting device, electricity was supplied to the device in the same manner as in Example 1.

Blue green light with a luminance of 100 cd/m² was obtained at a voltage of 8.3 V and a current density of 1.80 mA/cm². The luminous efficiency was 6 cd/A. The device was driven at a constant current and an initial luminance of 200 cd/m². The period of time until the luminance was halved to 100 cd/m² was measured and found to be 180 hours.

Comparative Example 4

An organic EL device was fabricated in the same manner as in Example 3 except for using the compound (F) instead of the compound (A).

After sealing the resulting device, electricity was supplied to the device in the same manner as in Example 1.

Green light with a luminance of 110 cd/m² was obtained at a voltage of 6.8 V and a current density of 0.65 mA/cm². The luminous efficiency was 17 cd/A. The device was driven at a constant current and an initial luminance of 1500 cd/m². The period of time until the luminance was halved to 750 cd/m² was measured and found to be 1060 hours.

Comparative Example 5

An organic EL device was fabricated in the same manner as in Example 3 except for using the compound (G) instead of the compound (C).

After sealing the resulting device, electricity was supplied to the device in the same manner as in Example 1.

Green light with a luminance of 101 cd/m² was obtained at a voltage of 6.2 V and a current density of 0.43 mA/cm². The luminous efficiency was 23 cd/A. The device was driven at a constant current and an initial luminance of 1500 cd/m². The period of time until the luminance was halved to 750 cd/m² was measured and found to be 1840 hours.

TABLE 2

| | Hole transporting layer | Emitting layer | Electron transporting layer | Voltage (V) | Current density (mA/cm²) | Luminance (cd/m²) | Luminous efficiency (cd/A) | Initial luminance (cd/m²) | Half life (h) |
|---|---|---|---|---|---|---|---|---|---|
| Example 1 | TCTA | Compound (A) Compound (B) | Compound (C) Alq$_3$ | 5.5 | 0.28 | 114 | 41 | 200 | 2050 |
| Example 2 | TCTA | Compound (A) Compound (D) | Compound (C) Alq$_3$ | 5.5 | 0.35 | 113 | 32 | 200 | 730 |
| Example 3 | TCTA | Compound (A) Compound (E) | Compound (C) Alq$_3$ | 5.5 | 0.14 | 108 | 77 (441 m/W) | 1500 | 3210 |
| Comparative Example 1 | HMTPD | Compound (A) Compound (B) | Compound (C) Alq$_3$ | 7.4 | 0.92 | 106 | 12 | 200 | 298 |
| Comparative Example 2 | NPD | Compound (A) Compound (B) | Compound (C) Alq$_3$ | 7.3 | 1.50 | 100 | 6 | 200 | 380 |

TABLE 2-continued

| | Hole transporting layer | Emitting layer | Electron transporting layer | Voltage (V) | Current density (mA/cm$^2$) | Luminance (cd/m$^2$) | Luminous efficiency (cd/A) | Initial luminance (cd/m$^2$) | Half life (h) |
|---|---|---|---|---|---|---|---|---|---|
| Comparative Example 3 | TCTA | Compound (F) Compound (B) | Compound (C) Alq$_3$ | 8.3 | 1.80 | 100 | 6 | 200 | 180 |
| Comparative Example 4 | TCTA | Compound (F) Compound (E) | Compound (C) Alq$_3$ | 6.8 | 0.65 | 110 | 17 | 1500 | 1060 |
| Comparative Example 5 | TCTA | Compound (A) Compound (E) | Compound (G) Alq$_3$ | 6.2 | 0.43 | 101 | 23 | 1500 | 1840 |

As shown in Table 2, the organic EL devices of Examples 1 to 3 are driven at a low voltage and exhibit a high luminous efficiency and a long lifetime in comparison with the organic EL devices of Comparative Examples 1 to 5.

INDUSTRIAL APPLICABILITY

As described above in detail, the organic EL device according to the invention exhibits a high luminous efficiency and a long lifetime and can be used as organic EL materials of various colors including blue. The organic EL device according to the invention may be applied in the fields of a display element, display, backlight, illumination light source, sign, signboard, interior, and the like, and is particularly suitable as a display element for a color display.

What is claimed is:

1. An organic electroluminescent device, comprising:
an anode;
a cathode;
a first layer;
a second layer; and
a third layer;
wherein the first layer, the second layer and the third layer are arranged between the anode and the cathode in order from the anode to the cathode;
at least one of the first to third layers comprises a phosphorescent compound;
at least one of the first to third layers is an emitting layer;
at least three compounds respectively forming the first layer, the second layer, and the third layer other than the phosphorescent compound are compounds of the following formula (3);
the compound forming the first layer is a compound of the formula (3) in which at least one of R$^1$ to R$^5$ and R$^8$ to R$^{11}$ comprises an aromatic group-substituted amino skeleton;
the compound forming the second layer is a compound of the formula (3) in which at least one of R$^1$ to R$^5$ and R$^8$ to R$^{11}$ is a substituent having an aromatic skeleton;
the compound forming the third layer is a compound of the formula (3) in which at least one of R$^1$ to R$^5$ and R$^8$ to R$^{11}$ comprises a nitrogen-containing aromatic five-membered ring, a nitrogen-containing aromatic six-membered ring, or a condensed ring of these rings;

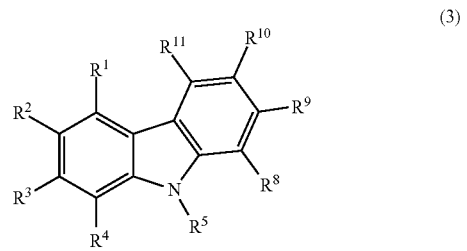

(3)

wherein:
each of R$^1$ to R$^5$ and R$^8$ to R$^{11}$ independently represents a hydrogen atom or a substituent;
provided that adjacent substituents may form a ring.
2. The organic electroluminescent device according to claim 1, wherein the compound forming the third layer is a compound of the formula (3) in which at least one of R$^1$ to R$^5$ and R$^8$ to R$^{11}$ comprises a nitrogen-containing aromatic six-membered ring.
3. The organic electroluminescent device according to claim 1, wherein the compound of formula (3) is a compound which does not have a molecular weight distribution.
4. The organic electroluminescent device according to claim 1, wherein:
the second layer is an emitting layer; and
the first layer and the third layer contact the emitting layer.
5. The organic electroluminescent device according to claim 1, wherein:
the first layer is a layer having a hole transporting property;
the second layer is an emitting layer; and
the third layer is a layer having an electron transporting property.
6. An organic electroluminescent device, comprising:
an anode;
a cathode;
a first layer;
a second layer; and
a third layer;
wherein the first layer, the second layer and the third layer are arranged between the anode and the cathode in order from the anode to the cathode;
at least one of the first to third layers comprises a phosphorescent compound;
at least one of the first to third layers is an emitting layer;
at least three compounds respectively forming the first layer, the second layer, and the third layer other than the phosphorescent compound are compounds of the following formula (2);
at least two of the three compounds have a singlet energy level of 3.3 eV or more;

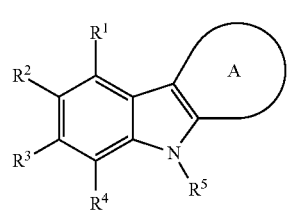

(2)

wherein:
each of R$^1$ to R$^5$ independently represents a hydrogen atom or a substituent; and
A represents a substituted or unsubstituted six to eight-membered aliphatic ring or aromatic ring which may contain a nitrogen atom;
provided that adjacent substituents may form a ring.

7. The organic electroluminescent device according to claim 6, wherein the compound of the formula (2) is a compound of the following formula (3) or (4)

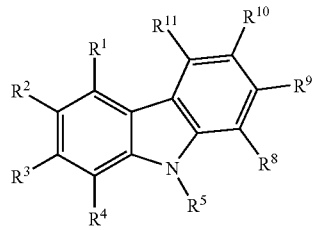
(3)

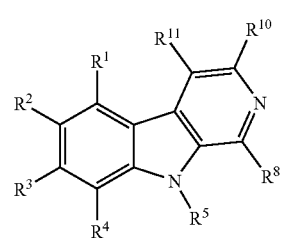
(4)

wherein each of $R^1$ to $R^5$ and $R^8$ to $R^{11}$ independently represents a hydrogen atom or a substituent, provided that adjacent substituents may form a ring.

8. The organic electroluminescent device according to claim 7, wherein the compound forming the first layer and the compound forming the second layer are compounds of the formula (3) in which at least one of $R^1$ to $R^5$ and $R^8$ to $R^{11}$ is a substituent having an aromatic skeleton.

9. The organic electroluminescent device according to claim 8, wherein:
the compound forming the first layer is a compound of the formula (3) in which at least one of $R^1$ to $R^5$ and $R^8$ to $R^{11}$ comprises an aromatic group-substituted amino skeleton; and
the compound forming the third layer is a compound of the formula (3) in which at least one of $R^1$ to $R^5$ and $R^8$ to $R^{11}$ comprises a nitrogen-containing aromatic five-membered ring, a nitrogen-containing aromatic six-membered ring, or a condensed ring of these rings.

10. The organic electroluminescent device according to claim 9, wherein the compound forming the third layer is a compound of the formula (3) in which at least one of $R^1$ to $R^5$ and $R^8$ to $R^{11}$ comprises a nitrogen-containing aromatic six-membered ring.

11. The organic electroluminescent device according to claim 6, wherein the compound of formula (2) is a compound which does not have a molecular weight distribution.

12. The organic electroluminescent device according to claim 6, wherein:
the second layer is an emitting layer; and
the first layer and the third layer contact the emitting layer.

13. The organic electroluminescent device according to claim 6, wherein:
the first layer is a layer having a hole transporting property;
the second layer is an emitting layer; and
the third layer is a layer having an electron transporting property.

14. An organic electroluminescent device, comprising:
an anode;
a cathode;
a first layer;
a second layer; and
a third layer;
wherein the first layer, the second layer and the third layer are arranged between the anode and the cathode in order from the anode to the cathode;
at least one of the first to third layers comprises a phosphorescent compound;
at least one of the first to third layers is an emitting layer;
at least three compounds respectively forming the first layer, the second layer, and the third layer other than the phosphorescent compound are compounds of the following formula (2);
at least two of the three compounds have a lowest triplet energy level of 2.7 eV or more;

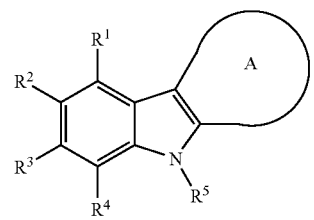
(2)

wherein:
each of $R^1$ to $R^5$ independently represents a hydrogen atom or a substituent; and
A represents a substituted or unsubstituted six to eight-membered aliphatic ring or aromatic ring which may contain a nitrogen atom;
provided that adjacent substituents may form a ring.

15. The organic electroluminescent device according to claim 14, wherein the compound of the formula (2) is a compound of the following formula (3) or (4)

(3)

(4)

wherein each of $R^1$ to $R^5$ and $R^8$ to $R^{11}$ independently represents a hydrogen atom or a substituent, provided that adjacent substituents may form a ring.

16. The organic electroluminescent device according to claim 15, wherein the compound forming the first layer and the compound forming the second layer are compounds of the formula (3) in which at least one of $R^1$ to $R^5$ and $R^8$ to $R^{11}$ is a substituent having an aromatic skeleton.

17. The organic electroluminescent device according to claim 16, wherein:
the compound forming the first layer is a compound of the formula (3) in which at least one of $R^1$ to $R^5$ and $R^8$ to $R^{11}$ comprises an aromatic group-substituted amino skeleton; and
the compound forming the third layer is a compound of the formula (3) in which at least one of $R^1$ to $R^5$ and $R^8$ to $R^{11}$ comprises a nitrogen-containing aromatic five-membered ring, a nitrogen-containing aromatic six-membered ring, or a condensed ring of these rings.

18. The organic electroluminescent device according to claim 17, wherein the compound forming the third layer is a compound of the formula (3) in which at least one of $R^1$ to $R^5$ and $R^8$ to $R^{11}$ comprises a nitrogen-containing aromatic six-membered ring.

19. The organic electroluminescent device according to claim 15, wherein the compound of formula (2) is a compound which does not have a molecular weight distribution.

20. The organic electroluminescent device according to claim 15, wherein:
the second layer is an emitting layer; and
the first layer and the third layer contact the emitting layer.

21. The organic electroluminescent device according to claim 15, wherein:
the first layer is a layer having a hole transporting property;
the second layer is an emitting layer; and
the third layer is a layer having an electron transporting property.

22. An organic electroluminescent device, comprising:
an anode;
a cathode;
a first layer;
a second layer; and
a third layer;
wherein the first layer, the second layer and the third layer are arranged between the anode and the cathode in order from the anode to the cathode;
at least one of the first to third layers comprises a phosphorescent compound;
at least one of the first to third layers is an emitting layer;
at least three compounds respectively forming the first layer, the second layer, and the third layer other than the phosphorescent compound are compounds of the following formula (2);
the phosphorescent compound has a lowest triplet energy level of 2.5 eV or more;

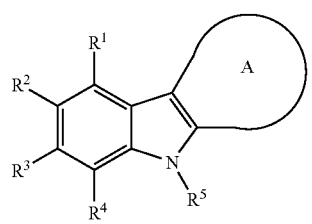

(2)

wherein:
each of $R^1$ to $R^5$ independently represents a hydrogen atom or a substituent; and
A represents a substituted or unsubstituted six to eight-membered aliphatic ring or aromatic ring which may contain a nitrogen atom;
provided that adjacent substituents may form a ring.

23. The organic electroluminescent device according to claim 22, wherein the compound of the formula (2) is a compound of the following formula (3) or (4)

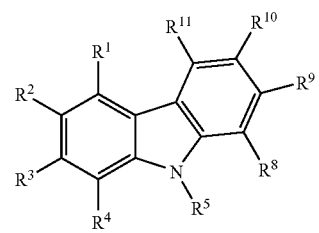

(3)

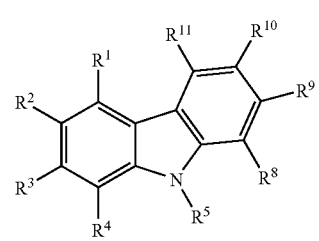

(4)

wherein each of $R^1$ to $R^5$ and $R^8$ to $R^{11}$ independently represents a hydrogen atom or a substituent, provided that adjacent substituents may form a ring.

24. The organic electroluminescent device according to claim 23, wherein the compound forming the first layer and the compound forming the second layer are compounds of the formula (3) in which at least one of $R^1$ to $R^5$ and $R^8$ to $R^{11}$ is a substituent having an aromatic skeleton.

25. The organic electroluminescent device according to claim 24, wherein:
the compound forming the first layer is a compound of the formula (3) in which at least one of $R^1$ to $R^5$ and $R^8$ to $R^{11}$ comprises an aromatic group-substituted amino skeleton; and
the compound forming the third layer is a compound of the formula (3) in which at least one of $R^1$ to $R^5$ and $R^8$ to $R^{11}$ comprises a nitrogen-containing aromatic five-membered ring, a nitrogen-containing aromatic six-membered ring, or a condensed ring of these rings.

26. The organic electroluminescent device according to claim 25, wherein the compound forming the third layer is a compound of the formula (3) in which at least one of $R^1$ to $R^5$ and $R^8$ to $R^{11}$ comprises a nitrogen-containing aromatic six-membered ring.

27. The organic electroluminescent device according to claim 23, wherein the compound of formula (2) is a compound which does not have a molecular weight distribution.

28. The organic electroluminescent device according to claim 23, wherein:
the second layer is an emitting layer; and
the first layer and the third layer contact the emitting layer.

29. The organic electroluminescent device according to claim 23, wherein:
the first layer is a layer having a hole transporting property;
the second layer is an emitting layer; and
the third layer is a layer having an electron transporting property.

* * * * *

UNITED STATES PATENT AND TRADEMARK OFFICE
CERTIFICATE OF CORRECTION

PATENT NO. : 8,039,121 B2
APPLICATION NO. : 11/480463
DATED : October 18, 2011
INVENTOR(S) : Toshihiro Iwakuma et al.

It is certified that error appears in the above-identified patent and that said Letters Patent is hereby corrected as shown below:

In column 2, line 47

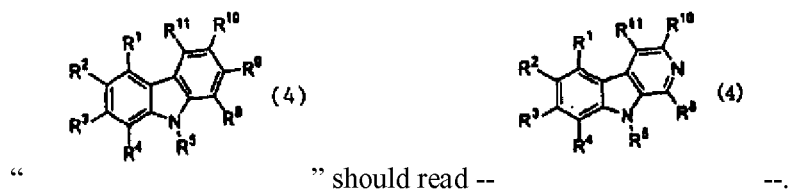

" should read -- --.

In column 5, line 1

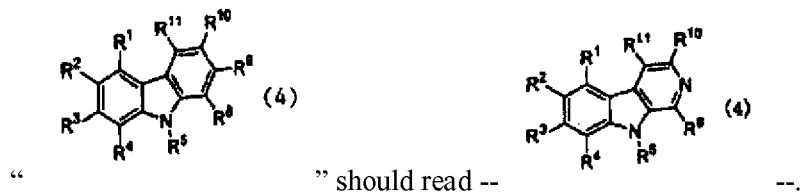

" should read -- --.

Signed and Sealed this
Twenty-seventh Day of March, 2012

David J. Kappos
*Director of the United States Patent and Trademark Office*

UNITED STATES PATENT AND TRADEMARK OFFICE
CERTIFICATE OF CORRECTION

PATENT NO. : 8,039,121 B2
APPLICATION NO. : 11/480463
DATED : October 18, 2011
INVENTOR(S) : Toshihiro Iwakuma et al.

Page 1 of 2

It is certified that error appears in the above-identified patent and that said Letters Patent is hereby corrected as shown below:

In column 2, line 47

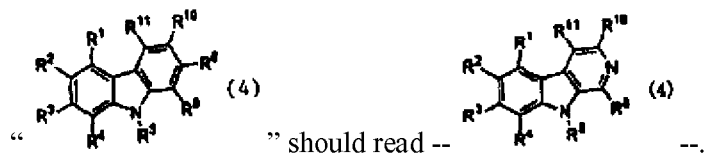

In column 5, line 1

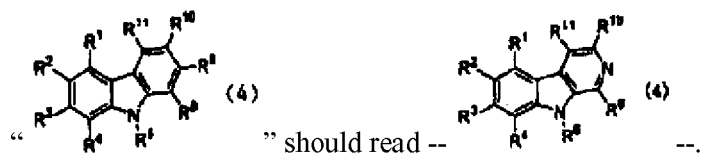

In column 40, line 50

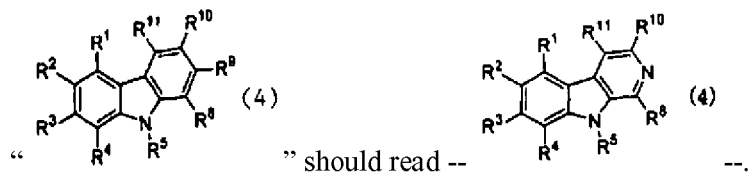

This certificate supersedes the Certificate of Correction issued March 27, 2012.

Signed and Sealed this
Thirtieth Day of October, 2012

David J. Kappos
*Director of the United States Patent and Trademark Office*

CERTIFICATE OF CORRECTION (continued)
U.S. Pat. No. 8,039,121 B2

In column 42, line 15

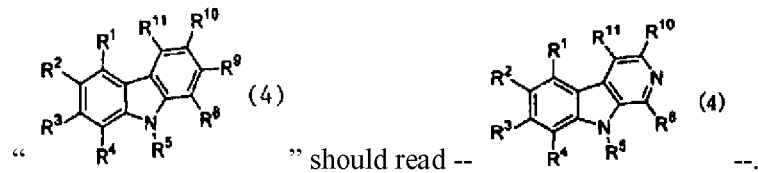

" should read -- --.